United States Patent
Chen et al.

(10) Patent No.: US 12,341,610 B2
(45) Date of Patent: Jun. 24, 2025

(54) SIMPLIFIED SYSTEM AND METHOD FOR BIT-INTERLEAVED CODED MODULATION WITH ITERATIVE DECODING (BICM-ID)

(71) Applicant: Hughes Network Systems, LLC, Germantown, MD (US)

(72) Inventors: Liping Chen, Bethesda, MD (US); Rohit Iyer Seshadri, Gaithersburg, MD (US); Neal David Becker, Olney, MD (US); Mustafa Eroz, Rockville, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 18/366,318

(22) Filed: Aug. 7, 2023

(65) Prior Publication Data

US 2025/0055598 A1 Feb. 13, 2025

(51) Int. Cl.
*H04L 1/00* (2006.01)
*H03M 13/11* (2006.01)
*H03M 13/37* (2006.01)

(52) U.S. Cl.
CPC ....... *H04L 1/0071* (2013.01); *H03M 13/1125* (2013.01); *H03M 13/3784* (2013.01)

(58) Field of Classification Search
None
See application file for complete search history.

(56) References Cited

U.S. PATENT DOCUMENTS

2013/0208836 A1 8/2013 Yamamoto
2013/0216221 A1 8/2013 Zhang et al.

FOREIGN PATENT DOCUMENTS

EP 2985916 B1 12/2018
WO 2004006443 A1 1/2004

OTHER PUBLICATIONS

ETSI EN 302 307-2 V1.3.1 (Jul. 2021) Second generation framing structure, channel coding and modulation systems for Broadcasting, Interactive Services, News Gathering and other broadband satellite applications; Part 2: DVB-S2 Extensions (DVB-S2X) (https://www.etsi.org/deliver/etsi_en/302300_302399/30230702/01.03.01_60/en_30230702v010301p.pdf).

(Continued)

*Primary Examiner* — Guerrier Merant
(74) *Attorney, Agent, or Firm* — NovoTechIP International PLLC

(57) ABSTRACT

Systems and methods for processing bit-interleaved coded modulation (BICM) signals from a BICM transmitter to generate information bit estimates of information in the BICM signals, including a decoder to generate the information bit estimates of the information in the received BICM signals and a symbol a posteriori probability (APP) generator to generate first symbol a posteriori probabilities (APPs) by processing the BICM signals based on Euclidean distances derived from the BICM signals, and further based on symbol probability log-likelihood ratios (SPLLRs) provided to the symbol APP generator by an extrinsic-information-based symbol probability log-likelihood ratio (SPLLR) generator. The SPLLR generator generates the SPLLRs directly from extrinsic information based on updated symbol APPs output from the decoder, without converting the extrinsic information into log-likelihoods (LLs), and the decoder generates the information bit estimates based on the first symbol APPs output from the symbol APP generator.

16 Claims, 10 Drawing Sheets

(56) References Cited

OTHER PUBLICATIONS

Pending U.S. Appl. No. 17/977,760, filed Oct. 31, 2022, of Applicant Hughes Network Systems, entitled Bit Interleaved Coded Modulation-Iterative Decoder for High-Speed Receiver.

M. C. Valenti et al., "Constellation Shaping for Bit-Interleaved Coded APSK," 2011 IEEE International Conference on Communications (ICC), Kyoto, Japan, 2011, pp. 1-5, doi: 10.1109/icc.2011.5962538 (https://ieeexplore.ieee.org/document/5962538).

G. Caire et al., "Bit-interleaved coded modulation," in IEEE Transactions on Information Theory, vol. 44, No. 3, pp. 927-946, May 1998, doi: 10.1109/18.669123 (https://ieeexplore.ieee.org/document/669123).

International Search Report and Written Opinion issued Nov. 13, 2024 in PCT/US2024/040893, filed Aug. 5, 2024.

Yi Fang et al: "Protograph-based Bit-Interleaved Coded Modulation: A Promising Bandwidth-Efficient Design Paradigm", arxiv.org, Cornell University Library, 201 Olin Library Cornell University Ithaca, NY 14853, Dec. 16, 2021 (Dec. 16, 2021), XP091119552.

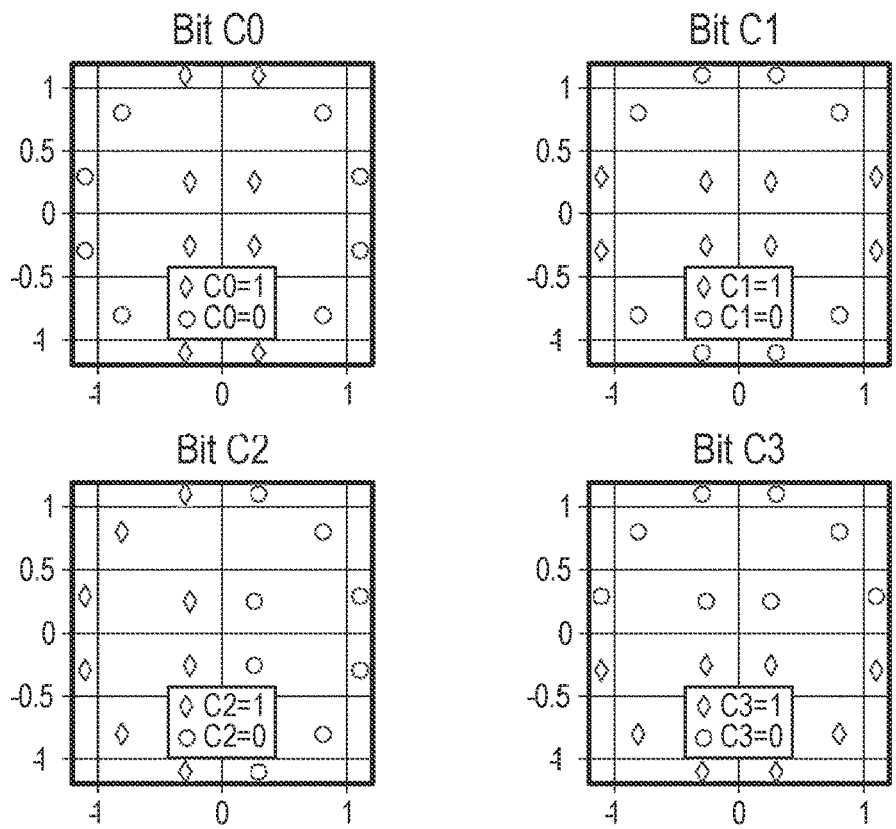
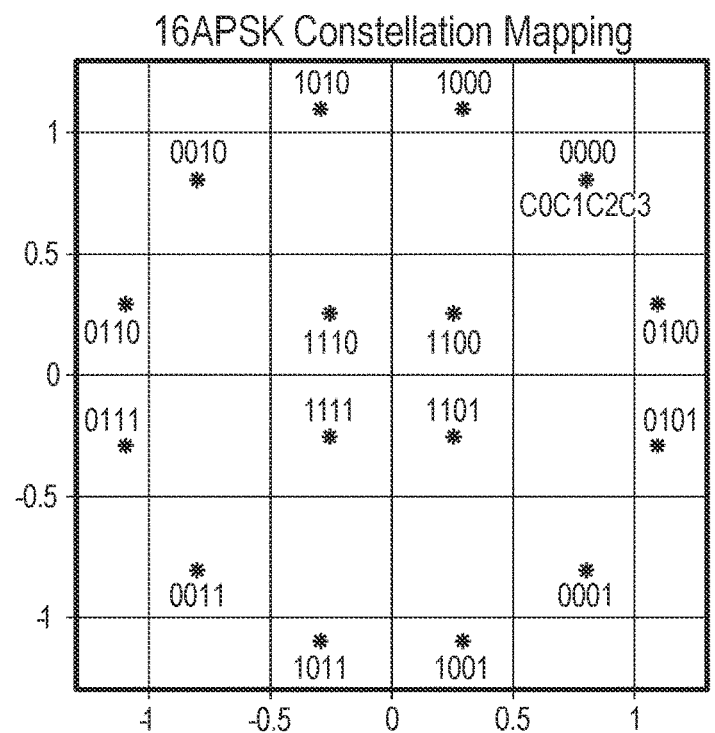
FIG. 5A

| Traditional ED Based SD Calculation Complexity | | | | | |
|---|---|---|---|---|---|
| Modulation | bps | Real Multiplications | Real Adders/ Subtractors | Max() Function Input Number | Max() Function Number |
| 8PSK | 3 | 19 | 19 | 4 | 6 |
| 16APSK | 4 | 36 | 52 | 8 | 8 |
| 32APSK | 5 | 69 | 101 | 16 | 10 |
| 64APSK(64QAM) | 6 | 134 | 198 | 32 | 12 |
| Simplified ED Utilizing Symmetry Based SD Calculation Complexity | | | | | |
| Modulation | bps | Real Multiplications | Real Adders/ Subtractors | Min()/Max() Function Input Number | Max() Function Number |
| 8PSK | 3 | 11 | 15 | 2 | 4 |
| 16APSK | 4 | 20 | 24 | 4/2 | 4/4 |
| 32APSK* | 5 | 37 | 45 | 8/4 | 4/6 |
| 64APSK(64QAM) | 6 | 70 | 102 | 16/8 | 4/8 |

FIG. 8

SIMPLIFIED SYSTEM AND METHOD FOR BIT-INTERLEAVED CODED MODULATION WITH ITERATIVE DECODING (BICM-ID)

TECHNICAL FIELD

The present application relates to simplified signal processing techniques for bit-interleaved coded modulation systems with iterative decoding (BICM-ID).

BACKGROUND

Techniques are known for iteratively exchanging soft-information between a binary LDPC (Low-Density Parity Check Code) decoder and symbol a posteriori probability generator in a receiver of a BICM system. Specifically, such iterative systems are known as bit-interleaved coded modulation with iterative decoding i.e., BICM-ID. These BICM-ID systems have the potential to improve the power efficiency of satellite links and this is an important enabler for techniques such as receiver-based interference cancellation. However, the conventional implementation complexity for current BICM-ID systems is quite high, and this has been a key impediment towards its adoption into state-of-the art receivers.

According to current ASIC (Application-specific integrated circuit) area estimation of BICM-ID implementation for current receivers, it is assumed that the Euclidean distance (ED) based symbol probability is generated at every BICM-ID outer iteration. This is done instead of calculating once and storing in memory since memory is more costly than logic in ASIC devices. Furthermore, the logic increase for BICM-ID operations is significant. In one implementation with only 24 parallel engines to generate the improved LLR (i.e., log likelihood ratio) input for a 360-engine LDPC decoder, the logic area will occupy approximately 95% of the current 360-engine DVBS2/X compatible LDPC decoder. This huge complexity increase from conventional satellite receivers prevents BICM-ID being a practical option in satellite receivers, even though it improves the spectral efficiency for the non-gray mapped constellations.

By way of background, it is imperative for state-of-the art wireless communication systems to operate with a high degree of efficiency to meet relentless data throughput demands. Furthermore, it is necessary to do this while contending with the conflicting realities of a very congested radio spectrum, the desire for low power-usage and the pragmatic need to keep hardware cost and complexity manageable. To quantify the trade-off between bandwidth and power efficiency, communication engineers have traditionally relied on a metric known as Shannon's channel capacity which helps determine the maximum spectral efficiency or rate at which information can be transmitted reliably through a channel, for some power (specifically, a signal power-to-noise power ratio (SNR)) requirement. The Shannon capacity can be shown as a function of SNR for the case of a transmitter communicating with a receiver over an additive white Gaussian noise (AWGN) channel and both employing only a single antenna (SISO). As an example, transmitting information at the rate of 2 bits-per-symbol reliably through an AWGN channel requires at least 5 dB SNR. Conversely, if the available SNR is 15 dB, it is not possible to extract more than 5 bits-per-symbol through the SISO-AWGN channel.

Shannon's limit, although groundbreaking, is an optimistic indicator of system performance since it assumes the use of Gaussian distributed modulation symbols. Practical systems, however, utilize symbols that are drawn with uniform probability from two-dimensional constellations having M-complex symbols such as QPSK (M=4), 8PSK (M=8), 16QAM (M=16) etc. In such scenarios, a better metric is the modulation constrained capacity, which measures the mutual information between the channel input and the channel output, under the constraint of utilizing uniformly distributed symbols belonging to two-dimensional constellations, such as those found in widely adopted standards such as DVB-S2 and DVB-S2X. This boundary can be determined for different practical modulation schemes and indicates a loss relative to the Shannon limit, especially at higher SNRs and increasing spectral efficiencies.

Pragmatic, state-of-the-art communication systems, such as 5G NR, DVB-S2/X employ powerful binary LDPC codes for forward error correction. In such systems, the information bits are encoded by the LDPC code and interleaved by a bit-interleaver. The interleaved bit-sequence is next mapped to one of M-possible symbols using a bit-to-symbol mapping rule such that the achievable performance also depends not only on the symbol constellation, but also on the mapping rule. This paradigm is known as Bit-interleaved coded modulation (BICM). The relevant performance limit for BICM systems is known as the pragmatic modulation capacity. For QPSK, the pragmatic modulation capacity is identical to the modulation constrained capacity. In contrast, there is a 0.25 dB SNR loss relative to the modulation constrained capacity for 4+12 APSK. This is because it is possible to realize perfect Gray bit-to-symbol mapping for QPSK thus ensuring a Hamming distance of 1 between the closest constellation symbols, i.e. their bit-to-symbol mapping label differs by exactly one bit. For the case of 4+12APSK and other power efficient APSK constellations, perfect Gray-labelling is generally not attainable, resulting in an SNR penalty with BICM.

SUMMARY

A receiver is provided for receiving and processing bit-interleaved coded modulation (BICM) signals from a BICM transmitter to generate information bit estimates of information in the BICM signals, the receiver including a decoder configured to generate the information bit estimates of the information in the received BICM signals, a symbol a posteriori probability (APP) generator configured to generate first symbol a posteriori probabilities (APPs) by processing the BICM signals based on Euclidean distances computed only for a quadrant to which received symbols derived from the BICM signals belong, and further based on symbol probability log-likelihood ratios (SPLLRs) provided to the symbol APP generator by an extrinsic-information-based symbol probability log-likelihood ratio (SPLLR) generator, wherein the extrinsic-information-based SPLLR generator is configured to generate the SPLLRs directly from extrinsic information based on updated symbol APPs output from the decoder, without converting the extrinsic information into log-likelihoods (LLs), and the decoder is configured to generate the information bit estimates based on the first symbol APPs output from the symbol APP generator.

A method for receiving and processing bit-interleaved coded modulation (BICM) signals from a BICM transmitter to generate information bit estimates of information in the BICM signals, the method including generating, via a decoder, the information bit estimates of the information in the received BICM signals, generating, via a symbol a posteriori probability (APP) generator, first symbol a posteriori probabilities (APPs) by processing the BICM signals based on Euclidean distances computed only for a quadrant to which received symbols derived from the BICM signals belong, and further based on symbol probability log-likelihood ratios (SPLLRs) provided to the symbol APP generator by an extrinsic-information-based symbol probability log-likelihood ratio (SPLLR) generator, wherein the extrinsic-information-based SPLLR generator is configured to generate the SPLLRs directly from extrinsic information based on updated symbol APPs output from the decoder, without converting the extrinsic information into log-likelihoods (LLs), and the decoder is configured to generate the information bit estimates based on the first symbol APPs output from the symbol APP generator.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

FIGS. 5A and 5B illustrate a constellation mapping and a constellation index, respectively, for a system using the receiver of FIG. 3 for a 4+12APSK system in accordance with an implementation of the disclosure.

FIG. 8 illustrates a table of the differing complexities of the soft decision calculations using traditional BICM-ID receivers and the simplified BICM-ID receiver implementation of FIG. 3, in accordance with an implementation of the disclosure.

DETAILED DESCRIPTION

In the following detailed description, numerous specific details are set forth by way of examples in order to provide a thorough understanding of the relevant teachings. It will be apparent to persons of ordinary skill, upon reading this description, that various aspects can be practiced without such details. In other instances, well known methods, procedures, components, and/or circuitry have been described at a relatively high-level, without detail, in order to avoid unnecessarily obscuring aspects of the present teachings.

Figure 1:
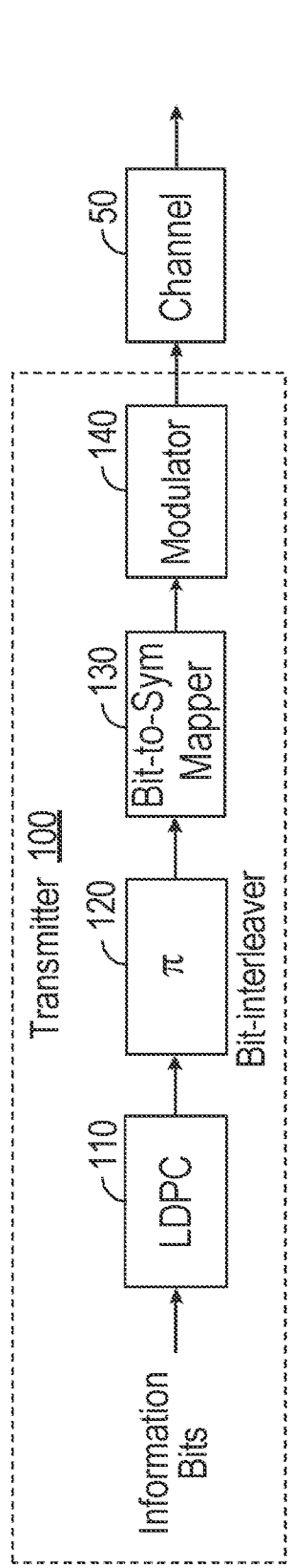
FIG. 1 illustrates a block diagram of a transmitter for transmitting BICM signals in a satellite system in accordance with an implementation of the disclosure.
Figure 2:
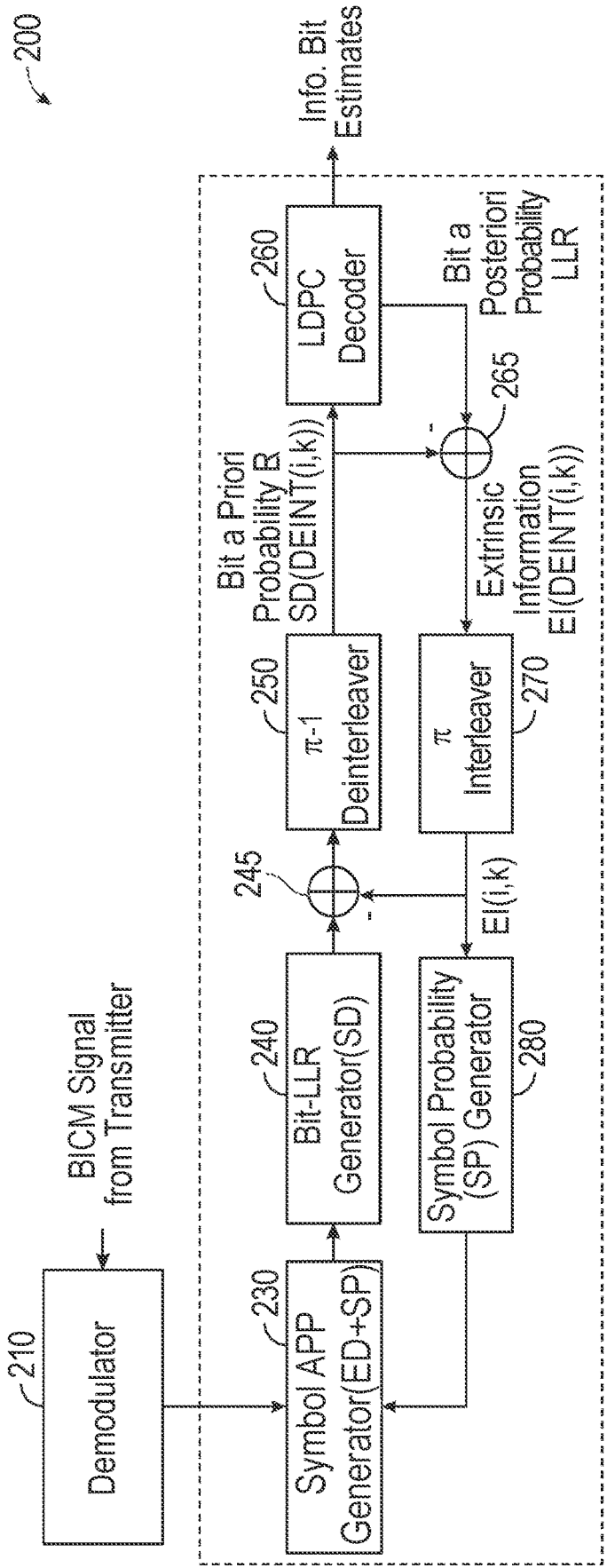
FIG. 2 illustrates an example of a BICM-ID working model used as a prototype in developing an improved BICM-ID receiver in accordance with an implementation of the disclosure.
Figure 3:
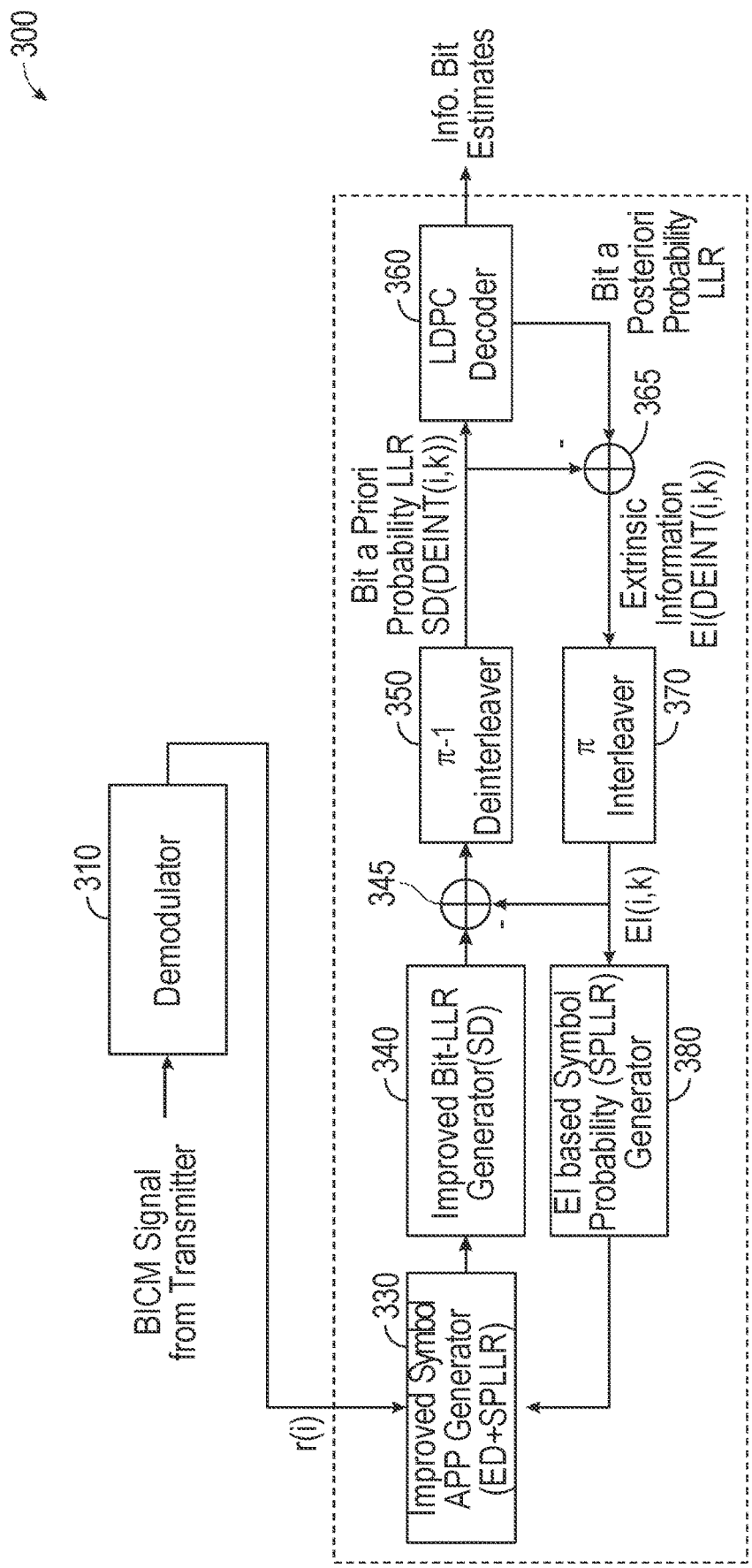
FIG. 3 illustrates an improved BICM-ID receiver developed from the prototype shown in FIG. 2 in accordance with an implementation of the disclosure.

One method to mitigate the performance loss due to imperfect Gray mapping in BICM is by iteratively exchanging bit-level extrinsic information between the LDPC decoder and the symbol a posteriori probability (APP) generator at the receiver. Such a process is known as bit-interleaved coded modulation with iterative decoding (BICM-ID). The block diagram of a working model BICM-ID system used as a prototype for developing the improved system described below (with respect to FIG. 3) is shown in FIGS. 1 and 2. Specifically, a transmitter 100 to provide BICM signals is shown in FIG. 1 and a working model (e.g., a prototype) of a receiver 200 for decoding the transmitted BICM signals is shown in FIG. 2. An improved receiver 300 in accordance with the present disclosure is shown in FIG. 3 and will be discussed in detail below after the following discussion regarding the working model of FIG. 2. The receiver 300 can also operate with BICM signals provided by the transmitter 100 shown in FIG. 1.

As shown in FIG. 1, a transmitter 100 transmits a data signal comprised of information bits over a communication channel 50 to a receiver 200 (or receiver 300 of FIG. 3). The data signal may carry image, video, audio, and/or other information. Although a single channel 50 of communication is shown in this example, it should be appreciated that the technology described herein may be implemented in multi-channel communication systems. Additionally, although some example components of a transmitter 100 and receivers 200 and 300 are illustrated in this example, it should be appreciated that other transmitter and/or receiver configurations can be implemented, the order of components can be varied, some components may be excluded, added, or combined, and that one or more of these components can be implemented in either digital form (e.g., as software running on a DSP or other processing device, with the addition of a DAC) or as analog components.

Transmitter 100 includes an LDPC encoder 110, interleaver 120, a bit-to-symbol mapper 130 and a modulator 140. In satellite communication system implementations, transmitter 100 may be a transmitter of a user terminal, such as, for example, a very small aperture terminal (VSAT) that transmits on an inroute of the satellite communication system. Alternatively, transmitter 100 may be a transmitter of a satellite gateway that transmits on an outroute.

The information bits provided to the LDPC encoder 110 may include, for example, images, video, audio, text and other data. Although the information bits can be from a bit source which is separate from transmitter 100, in some implementations, the bit source for the information bits may be incorporated into transmitter 100. The information bits provided to the LDPC encoder 110 can be encapsulated to form baseband data frames or data blocks.

LDPC encoder 110 performs forward error correction (FEC) by adding redundancy to information data bits of the input signal. FEC can improve the reliability of transmission by adding redundant information to the data being transmitted through the channel. This redundant information is used to correct for errors introduced by the transmission of the signal over the transmission channel or link during signal reception. Examples of forward error correction codes that can be applied by LDPC encoder 110 can include block codes (e.g., low-density parity check codes (LDPC), turbo codes, Reed-Solomon codes, Hamming codes, Hadamard codes, BCH codes, and so on), and convolutional codes. In one particular implementation, the LDPC encoder 110 can be located at the output of a Bose-Chaudhuri-Hocquenghem codes (BCH) encoder (not shown) followed by the LDPC encoder 110. The BCH encoder can process baseband data frames by adding additional redundant information based on one or more of the BCH encoding algorithms used in conjunction with the signal transmission protocol, and the LDPC encoder 110 can further processes the BCH encoded data frames to add a second layer of redundant information, or error correction information, to the data frames for error correction using one or more LDPC algorithms.

Interleaver 120 rearranges the encoded data bits to make distortion at receiver 200 (or receiver 300 of FIG. 3) more independent from bit to bit and provide additional error correction capability during reception. For example, sections (e.g., bits) of data frames including one or more layers of error correction can be rearranged with respect to location or position (i.e., in time) within the data frames.

The bit-to-symbol mapper 130 and the modulator 140 operate together to map the interleaved bits from the interleaver 120 (e.g., within the frames) to complex-valued modulation symbols representing positions (i.e., in amplitude, phase, and/or time) in a modulated signal waveform based on a symbol constellation map for a modulation scheme. The bits can be modulated using any of a number of different modulation techniques by the modulator 140. Examples of modulation schemes that can be implemented include amplitude and phase shift keying (APSK), e.g., 16-APSK, 32-APSK, 64-APSK, 128-APSK, or 256-APSK, quadrature phase shift keying (QPSK), 8PSK, M-ary phase shift keying (MPSK), quadrature amplitude modulation (QAM), and so forth.

Referring next to FIG. 2, the receiver 200 includes a demodulator 210 for demodulating the received BICM signal from the transmitter 100 The demodulated received BICM signals from the demodulator 210 are provided to a symbol a posteriori probability (APP) generator 230, which, in turn provides an output to a bit-LLR (Log Likelihood Ratio) generator 240 (which provides soft decisions SD for decoding, as will be discussed below). The symbol a posteriori probability (APP) generator 230 is structured to determine Euclidean distances as part of a demapping process for the received BICM signal that has been mapped and modulated in the transmitter 100. Alternately, Euclidean distances can be calculated by a separate Euclidean distance calculator (not shown), as discussed in Applicant's U.S. application Ser. No. 17/977,760, which is hereby incorporated by reference in its entirety. Other elements of the receiver 200, which will be discussed in greater detail below, are a first subtractor 245, a deinterleaver 250, an LDPC decoder 260, a second subtractor 265, an interleaver 270 and a symbol probability (SP) generator 280. It is noted that, although the present description uses and LDPC encoder and decoder as examples, the present description could be used for any encoder and decoder that can be used for BICM-ID communications.

Still referring to FIG. 2, an input to the LDPC decoder 260 is bit a priori probability and the decoder 260 output is bit a posterior probability. These probabilities are usually expressed as ratios in the log domain, namely Log Likelihood Ratios (LLRs). To begin the iterations at the receiver 200, the symbol a posteriori probability generator 230 and bit-LLR generator 240 generates bit-level log-likelihood ratios (LLR) as initial soft decisions based upon receiving the noisy signal. After deinterleaving of these soft decisions by deinterleaver 250 (and performing subtraction by the first subtractor 245 of any previous extrinsic information EI from the output of the LDPC decoder 260) they are fed as a priori information to the decoder 260.

As also shown in FIG. 2, the LDPC decoder 260 uses this a priori information to not only form estimates of the information bits but also to generate a posteriori probability LLRs of the associated code bits. Extrinsic information EI for the symbol a posteriori probability generator 230 is obtained by subtracting the a priori information at the input of the decoder 260 from the a posteriori LLRs at the output of the decoder 260 using the second subtractor 265. Specifically, this extrinsic information EI is passed through the bit interleaver 270 and provided to the symbol probability generator 280 to generate symbol probabilities SP to provide to the symbol APP generator 230. At this point, one outer iteration has been finished. For the next outer iteration, the LLRs will be updated based on the feedback extrinsic information EI and fed to LDPC decoder 260 to generate further a posteriori information, and the process will continue until the termination criteria is met.

The following discussion provides detailed mathematical implementation features regarding the operations of the receivers shown in FIGS. 2 and 3. To this end, the following notations used in BICM-ID algorithms are noted:

Max-log approximation: Logsumexp $(xi) = \ln \Sigma_i e^{x_i} = x_k + \ln \Sigma_i e^{x_i - x_k} \approx \max(x_k)$ The decoder output bit LLR is defined by $$LLR_i = \ln \frac{p(c_i = 0)}{p(c_i = 1)}, => LLR_i = \ln(p(c_i = 0)) - \ln(p(c_i = 1)) = LL_i^0 - LL_i^1$$

$\ln(p(c_i = 0)) =$ $$LL_i^0 = -\ln(1 + e^{-LLR_i}) \text{ and } \ln(p(c_i = 1)) = LL_i^1 = -\ln(1 + e^{+LLR_i})$$

$$LL_i^0 = -\ln(1 + e^{-LLR_i}) = -\ln(e^0 + e^{-LLR_i}) \approx -\max(0, -LLR_i)$$

$$LL_i^1 = -\ln(1 + e^{LLR_i}) = -\ln(e^0 + e^{LLR_i}) \approx -\max(0, LLR_i)$$

$$LL_i^0 = LLR_i + LL_i^1 \approx LLR_i - \max(0, LLR_i)$$

It should be noted that the max log approximation used here is just an example for implementation, and the same principles shown in this disclosure would apply if some other approximation was used, or even if exact log sum exp was used.

Given the number of $2^K$ constellation points, $\{s(m), m=0, \ldots, 2^K-1\}$, to map K channel bits $(c0, c1, \ldots, cK-1)$ and the AWGN SNR estimate; each of demodulated symbols $\{r(i), i=0, 1, \ldots, N-1\}$ are converted by the Euclidean distance calculator to $2^K$ Euclidean distances scaled by SNR, given by $\{ED(i, m) = -SNR \cdot |r(i) - s(m)|^2, i=0, 1, \ldots, N-1, m=0, 1, \ldots, 2^K-1\}$ before generating K soft decisioned bits, $\{SD(i, k), i=0, 1, \ldots, N-1, k=0, 1, \ldots, K-1\}$, per each of demodulated symbols.

After a given number of iterations, the second subtractor 265 generates the LLR extrinsic information, denoted as {EI (DEINT (i, k)), i=0, 1, ..., N-1, k=0, 1, ..., K-1}, which will be interleaved by interleaver 270 to match the order of demodulated symbols, {EI(i, k), i=0, 1, ..., N-1, k=0, 1, ..., K-1}. The Log Likelihood (LL) of the extrinsic information, denoted by BI(i, k, q), to be q=1 or 0 is converted from LLR, which is defined by:

$$BI(i, k, 1) = -LES(0, EI(i, k)),$$

$$BI(i, k, 0) = EI(i, k) - LES(0, EI(i, k)),$$

Where LES is logsumexp func or an approximation thereof.

The function of LES($x_0, x_1, \ldots, x_k$) is defined as follows:

$$LES(x_0, x_1, \ldots, x_k) = LES(LES(x_0, x_1, \ldots, x_{k-1}), x_k),$$

$$LES(x_0, x_1) = \max(x_0, x_1).$$

(Assuming maxlog approximation for logsumexp)

According to DVBS2-X standard, soft decisioned (SD) bits are deinterleaved by deinterleaver 250 depending on the number of constellation points via row write and column read to be fed to the LDPC decoder 260 as {SD(DEINT(i, k)), where symbol index i=0, 1, . . . , N−1, bit index of the symbol k=0, 1, . . . , K−1}

The soft decision bits in the form of Maximum Likelihood (ML) LLR indicates the confidence of the demapping decision, which are computed by the symbol APP generator 230 with ED based symbol probabilities ED(i, m) as well as the extrinsic information from previous iteration based symbol probabilities SP(i, m), where received symbol index i=0, 1, . . . , N−1, constellation index m=0, 1, . . . , $2^K-1$}, SP(i,m) are initially all 0 at first BICM-ID iteration.

$$LR(i, k) = \ln \frac{\sum_{s(m) \in A_{ck=0}} \exp\left(-\frac{|r(i) - s(m)|^2}{SNR} + \sum_{k=0}^{K-1} BI(i, k, ck \in s(m))\right)}{\sum_{s(m) \in A_{ck=1}} \exp\left(-\frac{|r(i) - s(m)|^2}{SNR} + \sum_{k=0}^{K-1} BI(i, k, ck \in s(m))\right)} =$$

$$\ln \frac{\sum_{s(m) \in A_{ck=0}} \exp(ED(i, m) + SP(i, m))}{\sum_{s(m) \in A_{ck=1}} \exp(ED(i, m) + SP(i, m))}$$

where ck denotes the kth mapping bit of constellation point s(m), $s_m \in A_{ck=1}$ means the symbols belong to a subset of constellations, of which the kth mapping bit equals to 1. BI(i, k, ck∈ s(m)) denotes the log likelihood of kth mapping bit of ith received symbol equals to the kth mapping bit of constellation s(m).

The usual implementation of the ML LLR or logsumexp will be reduced to max-log LLR, as follows:

$$SD(i, k) = LLR(i, k) =$$

$$\max_{s(m) \in A_{ck=0}}(ED(i, m) + SP(i, m)) - \max_{s(m) \in A_{ck=1}}(ED(i, m) + SP(i, m))$$

For an example, in the case of 8PSK, $2^K=8$ constellation points, the i-th symbol of which carries K=3 channel bits representing the binary form of the constellation. The bit mapping of the constellation is shown in FIG. 4A and constellation index is shown in FIG. 4B.

Figure 4A:
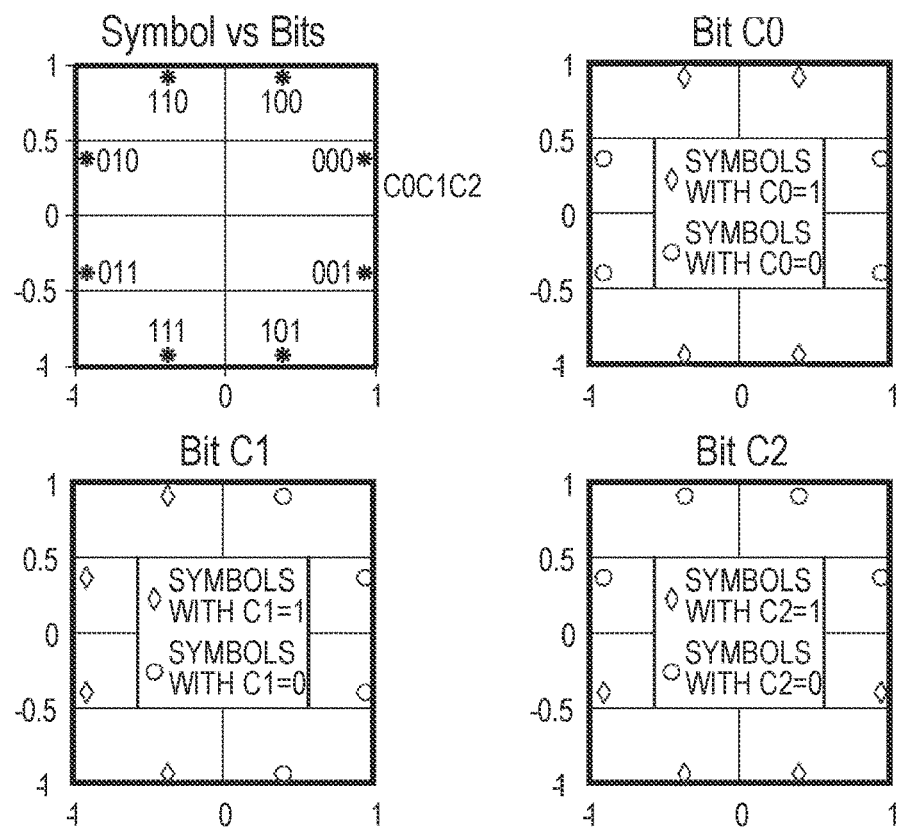
FIGS. 4A and 4B show a constellation mapping and a constellation index, respectively, for operations of the receiver of FIG. 2 for an 8PSK system in accordance with an implementation of the disclosure.
Figure 4B:
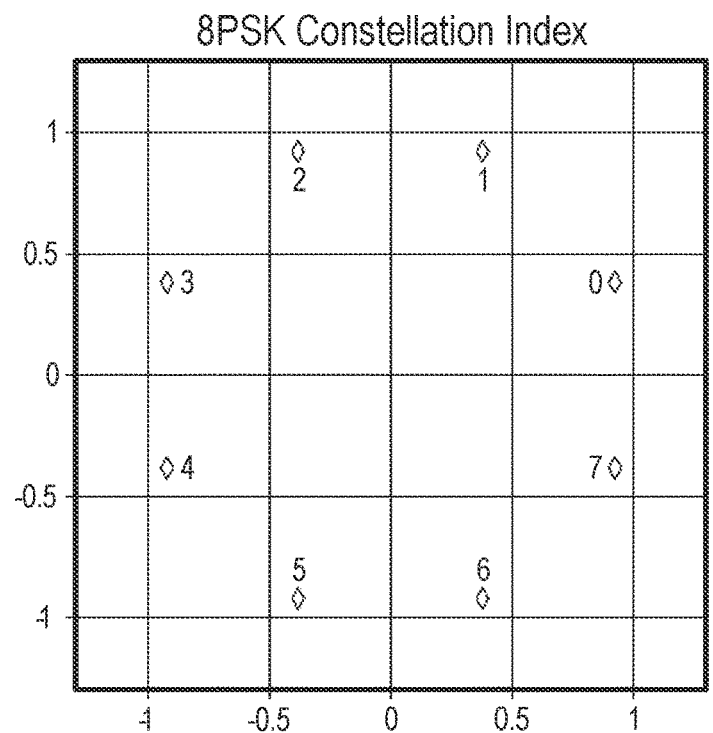

For the ith symbol, ck denotes the kth soft decisioned (c0,c1,c2 as shown in FIG. 4A) bit LLRs defined by SD(i,k) are given by finding the maximum improved symbol a posteriori probability (ED+SP) of all the symbols with the kth bit to be 0 (noted by diamond-shaped constellations in FIG. 4A) and to be 1 (noted by circular constellations in FIG. 4B), then perform subtraction to obtain improved bit LLR:

$$SD(i, 0) = LES(ED(i, 0) + SP(i, 0), ED(i, 3) + SP(i, 4) +$$

$$SP(i, 4), ED(i, 7) + SP(i, 7))) - LES(ED(i, 1) +$$

-continued $$SP(i, 1), ED(i, 2) + SP(i, 2), ED(i, 5) + SP(i, 5), ED(i, 6) + SP(i, 6))$$

$$SD(i, 1) = LES(ED(i, 0) + SP(i, 0), ED(i, 1) + SP(i, 1), ED(i, 6) +$$

$$SP(i, 6), ED(i, 7) + SP(i, 7)) - LES(ED(i, 2) +$$

$$SP(i, 2), ED(i, 3) + SP(i, 3), ED(i, 4) + SP(i, 4), ED(i, 5) + SP(i, 5))$$

$$SD(i, 2) = LES(ED(i, 0) + SP(i, 0), ED(i, 1) +$$

$$SP(i, 1), ED(i, 2) + SP(i, 2), ED(i, 3) +$$

$$SP(i, 3)) - LES(ED(i, 4) + SP(i, 4), ED(i, 4) +$$

$$SP(i, 4), ED(i, 6) + SP(i, 6), ED(i, 7) + SP(i, 7))$$

For constellation index m=0, 1, . . . , K−1, EI based symbol probability SP(i, m), which defines the probability of the ith symbol to be mth constellation defined in FIG. 4B, is calculated by sum up Log Likelihood probability of all the K bits pattern defined for the mth constellation, e.g. for symbol index to be 0, the bit pattern is 000, the probability of the received symbol r(i) to be constellation index 0 defined by SP(i, 0) is calculated by sum up the LL probability of all three mapping bits to be 0, BI(i, k, 0) for k=0, 1, 2.

$$SP(i, 0) = BI(i, 0, 0) + BI(i, 1, 0) + BI(i, 2, 0), c0c1c2 = "000"$$

$$SP(i, 1) = BI(i, 0, 1) + BI(i, 1, 0) + BI(i, 2, 0), c0c1c2 = "100"$$

$$SP(i, 2) = BI(i, 0, 1) + BI(i, 1, 1) + BI(i, 2, 0), c0c1c2 = "110"$$

$$SP(i, 3) = BI(i, 0, 0) + BI(i, 1, 1) + BI(i, 2, 0), c0c1c2 = "010"$$

$$SP(i, 4) = BI(i, 0, 0) + BI(i, 1, 1) + BI(i, 2, 1), c0c1c2 = "011"$$

$$SP(i, 5) = BI(i, 0, 1) + BI(i, 1, 1) + BI(i, 2, 1), c0c1c2 = "111"$$

$$SP(i, 6) = BI(i, 0, 1) + BI(i, 1, 0) + BI(i, 2, 1), c0c1c2 = "101"$$

$$SP(i, 7) = BI(i, 0, 0) + BI(i, 1, 0) + BI(i, 2, 1), c0c1c2 = "001"$$

The above discussion pertains to the operation of the receiver of FIG. 2. Turning now to FIG. 3, a receiver 300 is shown which was developed to significantly reduce the amount of calculation necessary in the receiver shown in FIG. 2 without adversely affecting the accuracy of the final information bit estimates. To this end, the receiver 300 of FIG. 3 includes a demodulator 310 for demodulating the received BICM signal from the transmitter 100 The demodulated signals are provided to an improved symbol a posteriori probability (APP) generator 330, which, in turn provides an output to an improved bit-LLR (Log Likelihood Ratio) generator 340 (which provides soft decisions (SDs) for decoding, as will be discussed below). In a first outer iteration for each received symbol, the quadrant is determined by the received symbol r(i), and for the rest of the iteration, the quadrant is determined by the maximum extrinsic based symbol probability, either SP (i,m) or SPLLR (i,m), for m=0, 1, . . . $2^K-1$. This provides a method to decide which quadrant the received symbol belongs to.

The symbol a posteriori probability (APP) generator 230 is structured to determine Euclidean distances only for a quadrant which received signals might belong to as part of a demapping process for the received BICM signal that has been mapped and modulated in the transmitter 100. Limiting the computation of Euclidean distances by focusing only on the quadrant to which the received symbols might belong is significant for further reducing complexity of the computations necessary for processing the received BICM signals. The determination of Euclidean distances is discussed in Applicant's U.S. application Ser. No. 17/977,760, which is hereby incorporated by reference in its entirety.

Other elements of the receiver 300 shown in FIG. 3, which will be discussed in greater detail below, are a first subtractor 345, a deinterleaver 350, an LDPC decoder 360, a second subtractor 365, an interleaver 370 and an improved symbol probability (SP) generator 380. The nature of the improvements implemented in the improved symbol APP generator (ED+SPLLR) 330, the improved bit-LLR generator (SD) 340 and the improved EI-based symbol probability (SPLLR) generator 380 are discussed below.

Specifically, the present disclosure proposes a novel receiver and method which will greatly reduce the implementation complexity of BICM-ID receivers. The simplification is performed at the calculation of log-likelihood ratio (LLR) by the symbol APP generator 330 and the bit-LLR soft decision generator 340 to provide the input to the LDPC decoder 360. The LLR calculation for BICM-ID receiver 300 will combine the channel input symbol probability which is based on Euclidean Distance (ED) and the decoder 360 feedback symbol probability which is based on extrinsic bit LLR of the decoder 360 output.

The feedback extrinsic information-based symbol probability calculation performed in the EI-based symbol probability (SPLLR) generator 380 can be simplified and, as will be shown below, does not involve any approximation, and hence no performance degradation. This is an advantage of using the feedback extrinsic based symbol probability calculation as a first simplification of the calculations in accordance with the present disclosure. The symbol probability based on ED can be further simplified by utilizing the symmetric properties of the constellation by only taking the information relative to only one quadrant of all the constellation, which will cause very small performance loss. This is also a significant feature as a second simplification of the present disclosure in greatly decreasing the implementation complexity. By combining both simplifications, the amount of mathematical operations for the bit-LLR calculation (soft decisions) provided at the output of the bit-LLR generator 340 can be reduced by approximately half in the receiver 300 of FIG. 3 in comparison with the receiver 200 of FIG. 2.

As noted above, the receiver 200 of FIG. 2 converts decoder 260 output bit LLR to bit LL (log likelihood first, and then sums up the LL of the corresponding mapping bits pattern to get the LL probability SP(i, m) of all $2^K$ constellation points, $\{s(m), m=0, \ldots, 2^K-1\}$. The math expression is shown in the previous discussion as:

$$SD(i, k) = LLR(i, k) =$$

$$\max_{s(m) \in A_{ck=0}} (ED(i, m) + SP(i, m)) - \max_{s(m) \in A_{ck=1}} (ED(i, m) + SP(i, m))$$

It has been determined that no substantial change will result to the numerical result of SD(i, k) if we subtract a common factor SP(i, n) from all the SP(i, m) in the above formula, where integer n can be any number from 0 to $2^K-1$. For convenience of notation, we choose n to be the constellation index, of which the corresponding bit pattern $c_0 c_1 c_2 \ldots c_{K-1}$ are all ones, we arrive at:

$$SD(i, k) = \max_{s(m) \in A_{ck=0}} (ED(i, m) + SP(i, m) - SP(i, n)) -$$

$$\max_{s(m) \in A_{ck=1}} (ED(i, m) + SP(i, m) - SP(i, n)) ==$$

$$\max_{s(m) \in A_{ck=0}} (ED(i, m) + SPLLR(i, m)) -$$

$$\max_{s(m) \in A_{ck=1}} (ED(i, m) + SPLLR(i, m))$$

Regarding the above discussion, it is noted that with regard to the symbol LLR:

$$r_i, SPLLR_i = \ln \frac{p(r_i = s(m))}{p(r_i = s(n))}, SP(i, n) = \ln p(r_i = s(n))$$

Keeping in mind the above discussion, BI(i, k, 1)=−LES (0, EI(i, k)), BI(i, k, 0)=EI(i, k)−LES(0, EI(i, k)), can derive that BI(i, k, 0)−BI(i, k, 1)=EI(i, k)

$$SPLLR(i, m) = SP(i, m) - SP(i, n) =$$

$$\sum_{k=0}^{K-1} BI(i, k, ck \in s(m)) - \sum_{k=0}^{K-1} BI(i, k, ck \in s(n)) = \sum_{ck \in s(m), ck=0} EI(i, k)$$

The improved lossless way to calculate symbol LL probability SP(i, m) is to use LLR instead of LL in the EI-based symbol probability generator 380. Firstly we calculate symbol LLR SPLLR(i, m) directly from bit LLR which is the output EI(i, k) of interleaver 370. Using 8PSK as an example, constellation index n=5 corresponds to three mapping bits to be "111", the SPLLR calculation for each constellation s(m) is as follows:

$$SPLLR(i, 0) = SP(i, 0) - SP(i, 5) = BI(i, 0, 0) +$$

$$BI(i, 1, 0) + BI(i, 2, 0) - (BI(i, 0, 1) + BI(i, 1, 1) + BI(i, 2, 1)) =$$

$$(BI(i, 0, 0) - BI(i, 0, 1)) + (BI(i, 1, 0) - BI(i, 1, 1)) +$$

$$(BI(i, 2, 0) - BI(i, 2, 1)) = EI(i, 0) + EI(i, 1) + EI(i, 2)$$

$$SPLLR(i, 1) = SP(i, 1) - SP(i, 5) = BI(i, 0, 1) +$$

$$BI(i, 1, 0) + BI(i, 2, 0) - (BI(i, 0, 1) + BI(i, 1, 1) + BI(i, 2, 1)) =$$

$$BI(i, 1, 0) - BI(i, 1, 1) + (BI(i, 2, 0) - BI(i, 2, 1)) = EI(i, 1) + EI(i, 2)$$

$$SPLLR(i, 2) = SP(i, 2) - SP(i, 5) = BI(i, 0, 1) + BI(i, 1, 1) + BI(i, 2, 0) -$$

$$(BI(i, 0, 1) + BI(i, 1, 1) + BI(i, 2, 1)) = BI(i, 2, 0) - BI(i, 2, 1) = EI(i, 2)$$

$$SPLLR(i, 3) = SP(i, 3) - SP(i, 5) = BI(i, 0, 0) +$$

$$BI(i, 1, 1) + BI(i, 2, 0) - (BI(i, 0, 1) + BI(i, 1, 1) + BI(i, 2, 1)) =$$

$$(BI(i, 0, 0) - BI(i, 0, 1)) + (BI(i, 2, 0) - BI(i, 2, 1)) = EI(i, 0) + EI(i, 2)$$

$$SPPL(i, 4) = SP(i, 4) - SP(i, 5) = BI(i, 0, 0) + BI(i, 1, 1) + BI(i, 2, 1) -$$

$$(BI(i, 0, 1) + BI(i, 1, 1) + BI(i, 2, 1)) = (BI(i, 0, 0) - BI(i, 0, 1)) = EI(i, 0)$$

$$SPLLR(i, 5) = SP(i, 5) - SP(i, 5) = 0$$

$$SPLLR(i, 6) = SP(i, 6) - SP(i, 5) = BI(i, 0, 1) + BI(i, 1, 0) + BI(i, 2, 1) -$$

$$(BI(i, 0, 1) + BI(i, 1, 1) + BI(i, 2, 1)) = (BI(i, 1, 0) - BI(i, 1, 1)) = EI(i, 1)$$

$$SPLLR(i, 7) = SP(i, 6) - SP(i, 5) = BI(i, 0, 0) +$$

-continued $$BI(i, 1, 0) + BI(i, 2, 1) - (BI(i, 0, 1) + BI(i, 1, 1) + BI(i, 2, 1)) =$$

$$(BI(i, 0, 0) - BI(i, 0, 1)) + (BI(i, 1, 0) - BI(i, 1, 1)) = EI(i, 0) + EI(i, 1)$$

For the 8PSK constellation as shown in FIGS. 4A and 4B, the symbol LLR of the constellation index m SPLLR(i, m) with respect to symbol index n=5 is just the sum of the bit LLRs for those three mapping bits which have a 0 in that bit position of constellation s(m). The final results below show that addition operation will only be needed for bit equal to 0, and that is half of all the addition for the current practice. In addition, there is no need to convert LLR to LL (or from EI to BI).

$$c0c1c2 = "000", SPLLR(i, 0) =$$
$$SP(i, 0) - SP(i, 5) = EI(i, 0) + EI(i, 1) + EI(i, 2)$$
$$c0c1c2 = "100", SPLLR(i, 1) = SP(i, 1) - SP(i, 5) = EI(i, 1) + EI(i, 2)$$
$$c0c1c2 = "110", SPLLR(i, 2) = SP(i, 2) - SP(i, 5) = EI(i, 2)$$
$$c0c1c2 = "010", SPLLR(i, 3) = SP(i, 3) - SP(i, 5) = EI(i, 0) + EI(i, 2)$$
$$c0c1c2 = "011", SPLLR(i, 4) = SP(i, 4) - SP(i, 5) = EI(i, 0)$$
$$c0c1c2 = "111", SPLLR(i, 5) = SP(i, 5) - SP(i, 5) = 0$$
$$c0c1c2 = "101", SPLLR(i, 6) = SP(i, 6) - SP(i, 5) = EI(i, 1)$$
$$c0c1c2 = "001", SPLLR(i, 7) = SP(i, 6) - SP(i, 5) = EI(i, 0) + EI(i, 1)$$

Secondly, we replace the SP with SPLLR in the calculation of the soft decisions SD by the bit-LLR generator 340 so that the final calculations will be as follows:

$$SD(i, 0) = LES(ED(i, 0) + SPLLR(i, 0), ED(i, 3) +$$
$$SPLLR(i, 3), ED(i, 4) + SPLLR(i, 4), ED(i, 7) +$$
$$SPLLR(i, 7)) - LES(ED(i, 1) + SPLLR(i, 1), ED(i, 2) +$$
$$SPLLR(i, 2), ED(i, 5) + SPLLR(i, 5), ED(i, 6) + SPLLR(i, 6))$$
$$SD(i, 1) = LES(ED(i, 0) + SPLLR(i, 0), ED(i, 1) +$$
$$SPLLR(i, 1), ED(i, 6) + SPLLR(i, 6), ED(i, 7) + SPLLR(i, 7)) -$$
$$LES(ED(i, 2) + SPLLR(i, 2), ED(i, 3) +$$
$$SPLLR(i, 3), ED(i, 4) + SPLLR(i, 4), ED(i, 5) + SPLLR(i, 5)$$
$$SD(i, 2) = LES(ED(i, 0) + SPLLR(i, 0), ED(i, 1) +$$
$$SPLLR(i, 1)ED(i, 2) + SPLLR(i, 2), ED(i, 3) +$$
$$SPLLR(i, 3) - LES(ED(i, 4) + SPLLR(i, 4), ED(i, 4) +$$
$$SPLLR(i, 4), ED(i, 6) + SPLLR(i, 6), ED(i, 7) + SPLLR(i, 7))$$

In general, the complexity of SPLLR calculations will be less than half of the SP calculation for any constellation. Simplification can be achieved in two ways: (1) It is unnecessary to calculate BI(i, k, 1) and BI(i, k, 0); and (2) SPLLR calculation only use the needed EI information for the corresponding bit=0 in the constellation bit mapping.

It is noted that there is no performance loss in the simplification by replacing symbol probability (SP) with symbol probability log-likelihood ratio (SPLLR), and the complexity is still significant since it is still necessary to calculate ED(i, m)+SPLLR(i, m) for all the constellation points as well as the two multi-input maximum function. When constellation becomes large, e.g., 64APSK or 128APSK, the math operation will be overwhelming and complexity for updating SD could be equivalent to or larger than that of the LDPC decoder.

Figure 5B:
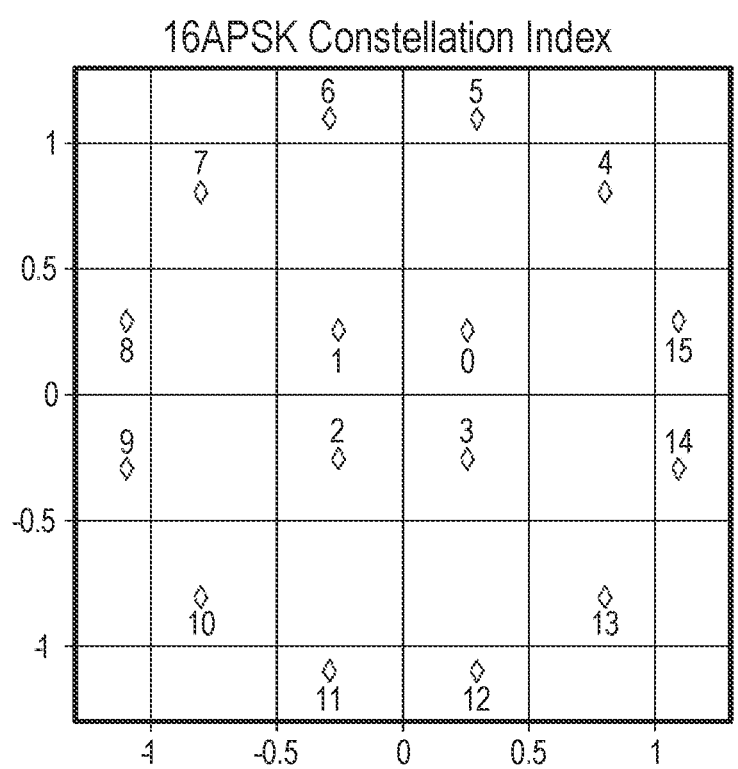

Symmetry of the constellation is leveraged next to further reduce complexity of Euclidean Distance (ED) computation by focusing on the quadrant to which the received symbol might belong. A 4+12APSK constellation shown in FIGS. 5A and 5B is used as an example. Four bits c0,c1,c2,c3 will be used to map to one of the 16 constellation points, for bit c0, the constellation points as diamonds corresponds to bit c0=1 and the constellation points shown as circles corresponds to c0=0. The same rule applies to bit c1,c2 and c3.

From FIG. 5A, we can find the corresponding constellation index set CI(k,q) and CI(k,q), where binary bit q=0 and 1, and bit index k=0, 1, . . . K−1.

q=0, k=0, constellation index set CI(0,0)={4 15 7 8 9 10 13 14}
q=0, k=1, constellation index set CI(1,0)={4 5 6 7 10 11 12 13}
q=0, k=2, constellation index set CI(2,0)={0 4 5 15 3 12 13 14}
q=0, k=3, constellation index set CI(3,0)={0 4 5 15 1 6 7 8}
q=1, k=0, constellation index set CI(0,1)={0 5 1 6 2 11 3 12}
q=1, k=1, constellation index set CI(1,1)={0 15 1 8 2 9 3 14}
q=1, k=2, constellation index set CI(2,1)={1 6 7 8 2 9 10 11}
q=1, k=3, constellation index set CI(3,1)={2 9 10 11 3 12 13 14}

For the i-th received symbol of which carries 4 channel bits, 4 soft decisioned bits are given by $$SD(i, 0) = LES(ED(i, 4) + SPLLR(i, 4), ED(i, 15) +$$
$$SPLLR(i, 15), ED(i, 7) + SPLLR(i, 7), ED(i, 8) +$$
$$SPLLR(i, 8), ED(i, 9) + SPLLR(i, 9), ED(i, 10) +$$
$$SPLLR(i, 10), ED(i, 13) + SPLLR(i, 13), ED(i, 14) +$$
$$SPLLR(i, 14) - LES(ED(i, 0) + SPLLR(i, 0), ED(i, 5) +$$
$$SPLLR(i, 5), ED(i, 1) + SPLLR(i, 1), ED(i, 6) + SPLLR(i, 6)ED(i, 2) +$$
$$SPLLR(i, 2), ED(i, 11) + SPLLR(i, 11), ED(i, 3) +$$
$$SPLLR(i, 3), ED(i, 12) + SPLLR(i, 12)) = LES(ED(i, m) +$$
$$SPLLR(i, m), m \in CI(0, 0)) - LES(ED(i, n) + SPLLR(i, n), n \in CI(0, 1))$$
$$SD(i, 1) = LES(ED(i, 4) + SPLLR(i, 4), ED(i, 5) +$$
$$SPLLR(i, 5), ED(i, 6) + SPLLR(i, 6), ED(i, 7) + SPLLR(i, 7), ED(i, 10) +$$
$$SPLLR(i, 10), ED(i, 11) + SPLLR(i, 11), ED(i, 12) +$$
$$SPLLR(i, 12), ED(i, 13) + SPLLR(i, 13)) -$$
$$LES(ED(i, 0) + SPLLR(i, 0), ED(i, 15) + SPLLR(i, 15), ED(i, 1) +$$
$$SPLLR(i, 1), ED(i, 8) + SPLLR(i, 8), ED(i, 2) + SPLLR(i, 2), ED(i, 9) +$$
$$SPLLR(i, 9), ED(i, 3) + SPLLR(i, 3), ED(i, 14) + SPLLR(i, 14) =$$
$$LES(ED(i, m) + SPLLR(i, m), m \in CI(1, 0)) -$$
$$LES(ED(i, n) + SPLLR(i, n), n \in CI(1, 1))$$
$$SD(i, 2) = LES(ED(i, 0) + SPLLR(i, 0), ED(i, 4) + SPLLR(i, 4), ED(i, 5) +$$

-continued $SPLLR(i, 5), ED(i, 15) + SPLLR(i, 15), ED(i, 3) +$ $SPLLR(i, 3), ED(i, 12) + SPLLR(i, 12), ED(i, 13) +$ $SPLLR(i, 13), ED(i, 14) + SPLLR(i, 14)) - LES(ED(i, 1) +$ $SPLLR(i, 1), ED(i, 6) + SPLLR(i, 6), ED(i, 7) +$ $SPLLR(i, 7), ED(i, 8) + SPLLR(i, 8), ED(i, 2) + SPLLR(i, 2), ED(i, 9) +$ $SPLLR(i, 9), ED(i, 10) + SPLLR(i, 10), ED(i, 11) +$ $SPLLR(i, 11) = LES(ED(i, m) + SPLLR(i, m), m \in CI(2, 0)) -$ $LES(ED(i, n) + SPLLR(i, n), n \in CI(2, 1))$ $SD(i, 3) = LES(ED(i, 0) + SPLLR(i, 0), ED(i, 4) +$ $SPLLR(i, 4), ED(i, 5) + SPLLR(i, 5), ED(i, 15) +$ $SPLLR(i, 15), ED(i, 1) + SPLLR(i, 1), ED(i, 6) +$ $SPLLR(i, 6), ED(i, 7) + SPLLR(i, 7), ED(i, 8) + SPLLR(i, 8)) -$ $LES(ED(i, 2) + SPLLR(i, 2), ED(i, 9) + SPLLR(i, 9), ED(i, 10) +$ $SPLLR(i, 10), ED(i, 11) + SPLLR(i, 11), ED(i, 3) +$ $SPLLR(i, 3), ED(i, 12) + SPLLR(i, 12), ED(i, 13) +$ $SPLLR(i, 13), ED(i, 14) + SPLLR(i, 14) = LES(ED(i, m) +$ $SPLLR(i, m), m \in CI(3, 0)) - LES(ED(i, n) + SPLLR(i, n), n \in CI(3, 1))$ It is noted that the complexity of SD(i, k) calculation for 4+12APSK constellation has greatly increased compared with 8PSK. Since $\{ED(i,m)=-SNR\cdot|r(i)-s(m)|^2, i=0, 1, \ldots, N-1, m=0, 1, \ldots, 2^K-1\}$, max(ED(i, m))), m∈CI(m, k) and is equivalent to $\min_m(SNR\cdot|r(i)-s(m)|^2)$. The distance defined by $|r(i)-s(m)|$ will be smaller in the quadrant r(i) belongs than the rest of the quadrants.

Also, we can separate ED(i, m) into real and imaginary expression:

$ED(i, m) = -SNR \cdot |r(i) - s(m)|^2 =$ $-SNR \cdot (\text{real}(r(i) - s(m))^2 + \text{imag}(r(i) - s(m))^2) = EDI(i, m) + EDQ(i, m)$ For mapping bits C0 and C1 as shown in FIG. 5A, we will only calculate the ED(i, m) in the quadrant of interest which will reduce the amount of ED calculations as well as the number of entries of max function from 8 to 2. For bit C2, we can only calculate the distance using real part EDI(i, m) instead of complex number. For bit C3, we can only calculate the distance using imaginary part EDQ (i, m) instead of complex number. These ED calculations may be performed by the symbol APP generator 330, as discussed above.

The simplified or reduced SD calculation in the bit-LLR generator 340 of 4 soft decisioned bits are given as follows according to different quadrants. In a first outer iteration for each received symbol, the quadrant is determined by the received symbol r(i), and for the rest of the iteration the quadrant is determined by the maximum extrinsic based symbol probability, either SP(i, m) or SPLLR(i, m), for m=0, 1, . . . , $2^K-1$. If the received symbol is located in first quadrant, only the constellation point with index m={0,4,5,15} will be used to update the SD for bit C0 and C1; the constellation point with index m={0,4,5,15,1,6,7,8} will be used for bit C2 and only real part will be used for ED calculation; the constellation point with index m={0,4,5,15,3,12,13,14} will be used for bit C3 and only imaginary part will be used for ED calculation. The complexity of computation will be reduced significantly as shown below.

If first quadrant:

$SD(i, 0) = LES(ED(i, 4) + SPLLR(i, 4), ED(i, 15) + SPLLR(i, 15)) -$ $LES(ED(i, 0) + SPLLR(i, 0), ED(i, 5) + SPLLR(i, 5))$ $SD(i, 1) = LES(ED(i, 4) + SPLLR(i, 4), ED(i, 5) + SPLLR(i, 5)) -$ $LES(ED(i, 0) + SPLLR(i, 0), ED(i, 15) + SPLLR(i, 15))$ $SD(i, 2) = LES(EDI(i, 0) + SPLLR(i, 0), EDI(i, 4) +$ $SPLLR(i, 4), EDI(i, 5) + SPLLR(i, 5), EDI(i, 15) + SPLLR(i, 15)) -$ $LES(EDI(i, 1) + SPLLR(i, 1), EDI(i, 6) +$ $SPLLR(i, 6), EDI(i, 7) + SPLLR(i, 7), EDI(i, 8) + SPLLR(i, 8))$ $SD(i, 3) = LES(EDQ(i, 0) + SPLLR(i, 0), EDQ(i, 4) +$ $SPLLR(i, 4), EDQ(i, 5) + SPLLR(i, 5), EDQ(i, 15) + SPLLR(i, 15)) -$ $LES(EDQ(i, 3) + SPLLR(i, 3), EDQ(i, 12) +$ $SPLLR(i, 12), EDQ(i, 13) + SPLLR(i, 13), EDQ(i, 14) + SPLLR(i, 14))$

If second quadrant:

$SD(i, 0) = LES(ED(i, 7) + SPLLR(i, 7), ED(i, 8) + SPLLR(i, 8)) -$ $LES(ED(i, 1) + SPLLR(i, 1), ED(i, 6) + SPLLR(i, 6))$ $SD(i, 1) = LES(ED(i, 6) + SPLLR(i, 6), ED(i, 7) + SPLLR(i, 7)) -$ $LES(ED(i, 1) + SPLLR(i, 1), ED(i, 8) + SPLLR(i, 8))$ $SD(i, 2) = LES(EDI(i, 0) + SPLLR(i, 0), EDI(i, 4) +$ $SPLLR(i, 4), EDI(i, 5) + SPLLR(i, 5), EDI(i, 15) + SPLLR(i, 15)) -$ $LES(EDI(i, 1) + SPLLR(i, 1), EDI(i, 6) +$ $SPLLR(i, 6), EDI(i, 7) + SPLLR(i, 7), EDI(i, 8) + SPLLR(i, 8))$ $SD(i, 3) = LES(EDQ(i, 1) + SPLLR(i, 1), EDQ(i, 6) +$ $SPLLR(i, 6), EDQ(i, 7) + SPLLR(i, 7), EDQ(i, 8) + SPLLR(i, 8)) -$ $LES(EDQ(i, 2) + SPLLR(i, 2), EDQ(i, 9) +$ $SPLLR(i, 9), EDQ(i, 10) + SPLLR(i, 10), EDQ(i, 11) + SPLLR(i, 11))$

If third quadrant:

$SD(i, 0) = LES(ED(i, 9) + SPLLR(i, 9), ED(i, 10) + SPLLR(i, 10)) -$ $LES(ED(i, 2) + SPLLR(i, 2), ED(i, 11) + SPLLR(i, 11))$ $SD(i, 1) = LES(ED(i, 10) + SPLLR(i, 10), ED(i, 11) + SPLLR(i, 11)) -$ $LES(ED(i, 2) + SPLLR(i, 2), ED(i, 9) + SPLLR(i, 9))$ $SD(i, 2) = LES(EDI(i, 3) + SPLLR(i, 3), EDI(i, 12) +$ $SPLLR(i, 12), EDI(i, 13) + SPLLR(i, 13), EDI(i, 14) + SPLLR(i, 14)) -$ $LES(EDI(i, 2) + SPLLR(i, 2), EDI(i, 9) +$ $SPLLR(i, 9), EDI(i, 10) + SPLLR(i, 10), EDI(i, 11) + SPLLR(i, 11))$ $SD(i, 3) = LES(EDQ(i, 1) + SPLLR(i, 1), EDQ(i, 6) +$ $SPLLR(i, 6), EDQ(i, 7) + SPLLR(i, 7), EDQ(i, 8) + SPLLR(i, 8)) -$

-continued $$LES(EDQ(i, 2) + SPLLR(i, 2), EDQ(i, 9) +$$
$$SPLLR(i, 9), EDQ(i, 10) + SPLLR(i, 10), EDQ(i, 11) + SPLLR(i, 11))$$

If fourth quadrant:

$$SD(i, 0) = LES(ED(i, 13) + SPLLR(i, 13), ED(i, 14) + SPLLR(i, 14)) -$$
$$LES(ED(i, 3) + SPLLR(i, 3), ED(i, 12) + SPLLR(i, 12))$$
$$SD(i, 1) = LES(ED(i, 12) + SPLLR(i, 12), ED(i, 13) + SPLLR(i, 13)) -$$
$$LES(ED(i, 3) + SPLLR(i, 3), ED(i, 14) + SPLLR(i, 14))$$
$$SD(i, 2) = LES(EDI(i, 3) + SPLLR(i, 3), EDI(i, 12) +$$
$$SPLLR(i, 12), EDI(i, 13) + SPLLR(i, 13), EDI(i, 14) + SPLLR(i, 14)) -$$
$$LES(EDI(i, 2) + SPLLR(i, 2), EDI(i, 9) +$$
$$SPLLR(i, 9), EDI(i, 10) + SPLLR(i, 10), EDI(i, 11) + SPLLR(i, 11))$$
$$SD(i, 3) = LES(EDQ(i, 0) + SPLLR(i, 0), EDQ(i, 4) +$$
$$SPLLR(i, 4), EDQ(i, 5) + SPLLR(i, 5), EDQ(i, 15) + SPLLR(i, 15)) -$$
$$LES(EDQ(i, 3) + SPLLR(i, 3), EDQ(i, 12) +$$
$$SPLLR(i, 12), EDQ(i, 13) + SPLLR(i, 13), EDQ(i, 14) + SPLLR(i, 14))$$

Figure 6:
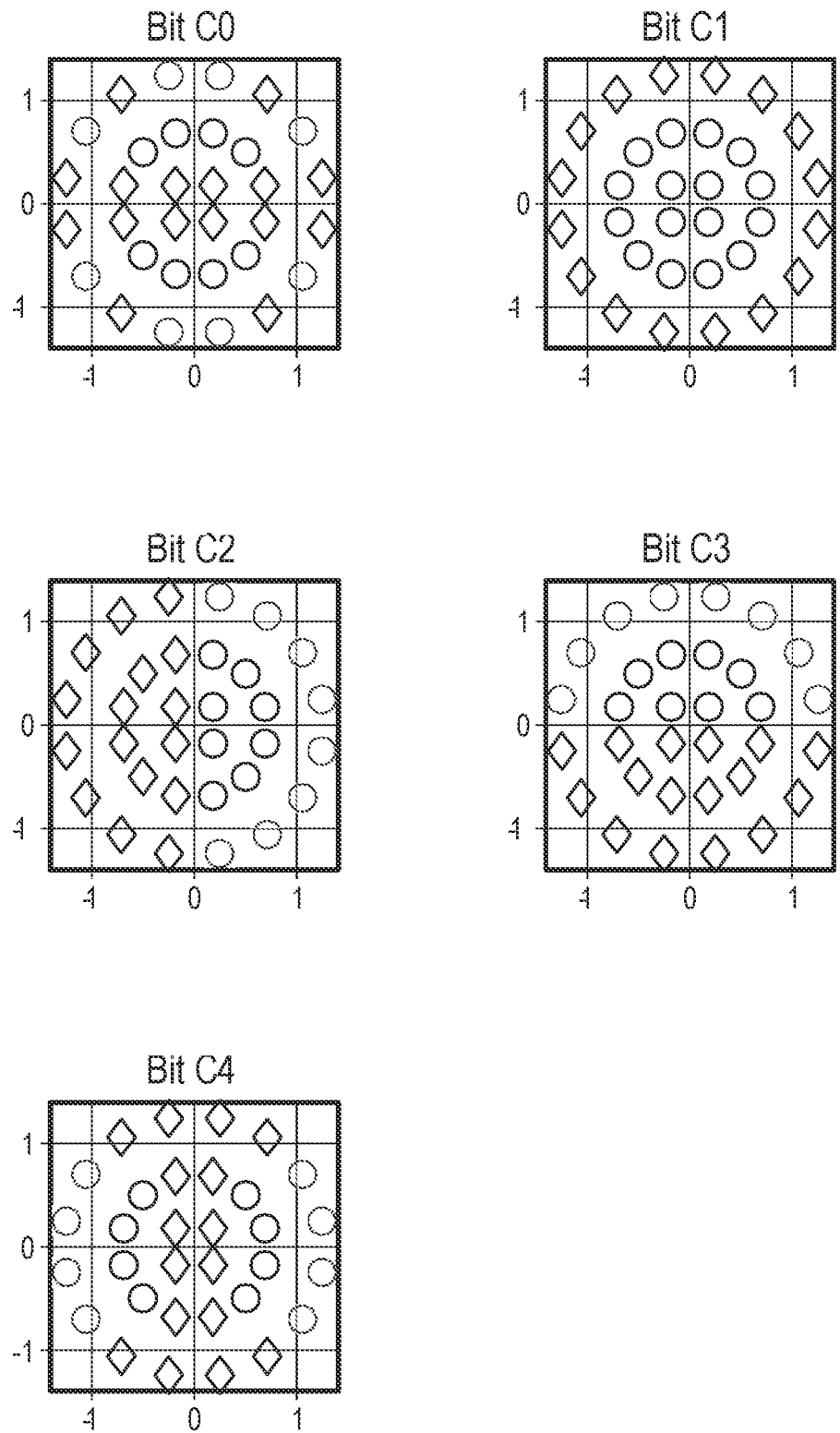
FIG. 6 illustrates a constellation that can be used to simplify the soft decision calculations for a 32APSK system in accordance with an implementation of the disclosure.
Figure 7:
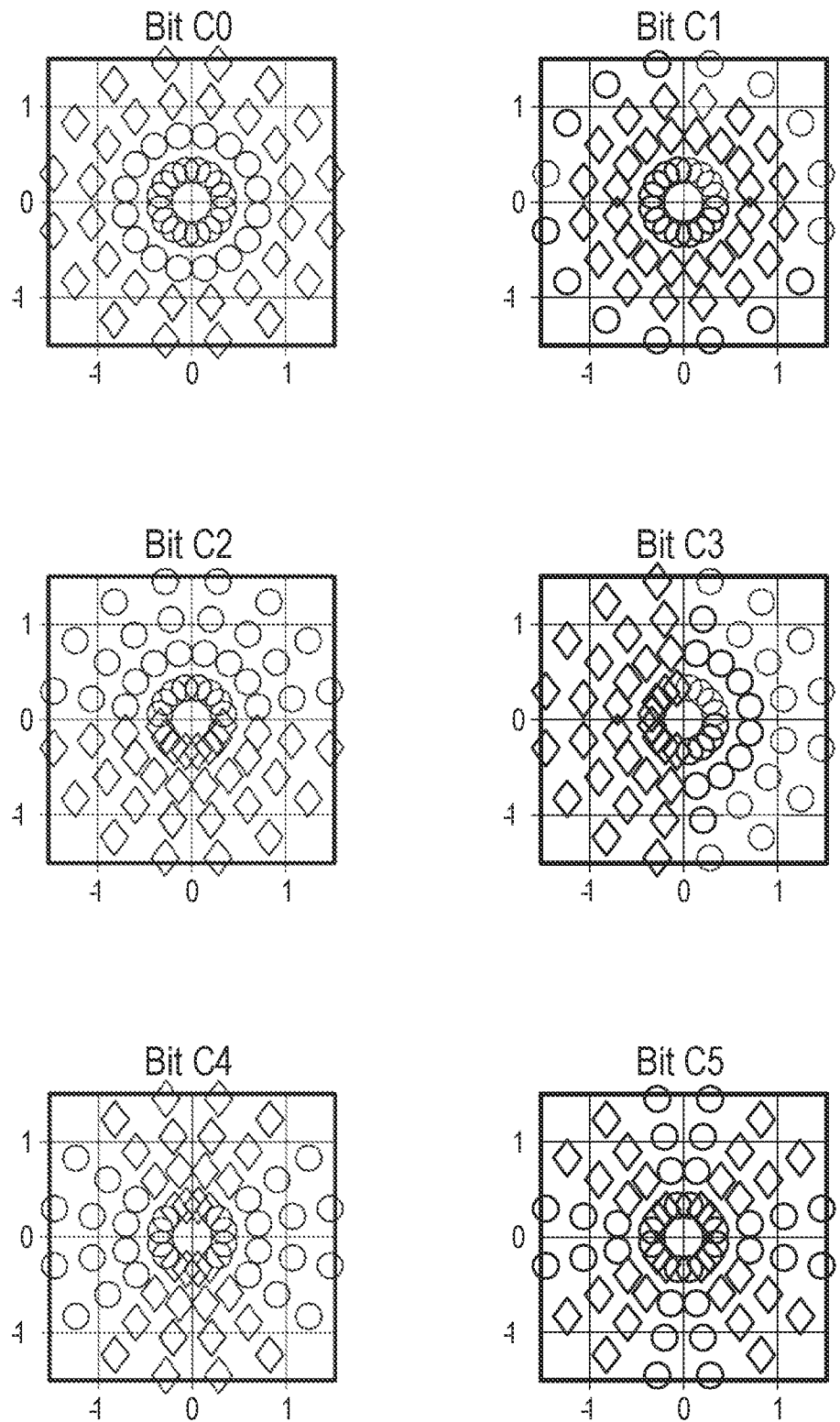
FIG. 7 illustrates a constellation that can be used to simplify the soft decision calculations for a 64APSK system in accordance with an implementation of the disclosure.

Other constellations, as shown in FIG. 6 and FIG. 7 for 32APSK and 64APSK, respectively, share the same symmetry and can also be adapted to simplify the SD calculations. Only the real part is used for bit C2 and the imaginary part is used for bit C3, only one quadrant is used for the rest of the mapping bits. These simplified calculations can be performed in the symbol APP generator 330. The table shown in FIG. 8 will summarize the savings by utilizing the constellation symmetry for different constellations. Comparing the top and bottom part of the table, we can see the complexity can be reduced by about 50%.

FIG. 8 shows a table of comparisons between the implementation complexities of the operations using the traditional BICM-ID receivers and the simplified BICM-ID receiver implementation shown in the receiver of FIG. 3. Since there is some information loss in the simplifications achieved by the receiver of FIG. 3, there will be some performance loss involved. However, from simulation tests run by the inventors, there will be less than 0.1 dB degradation caused by symmetry-based simplification for all the four constellations.

Figure 9:
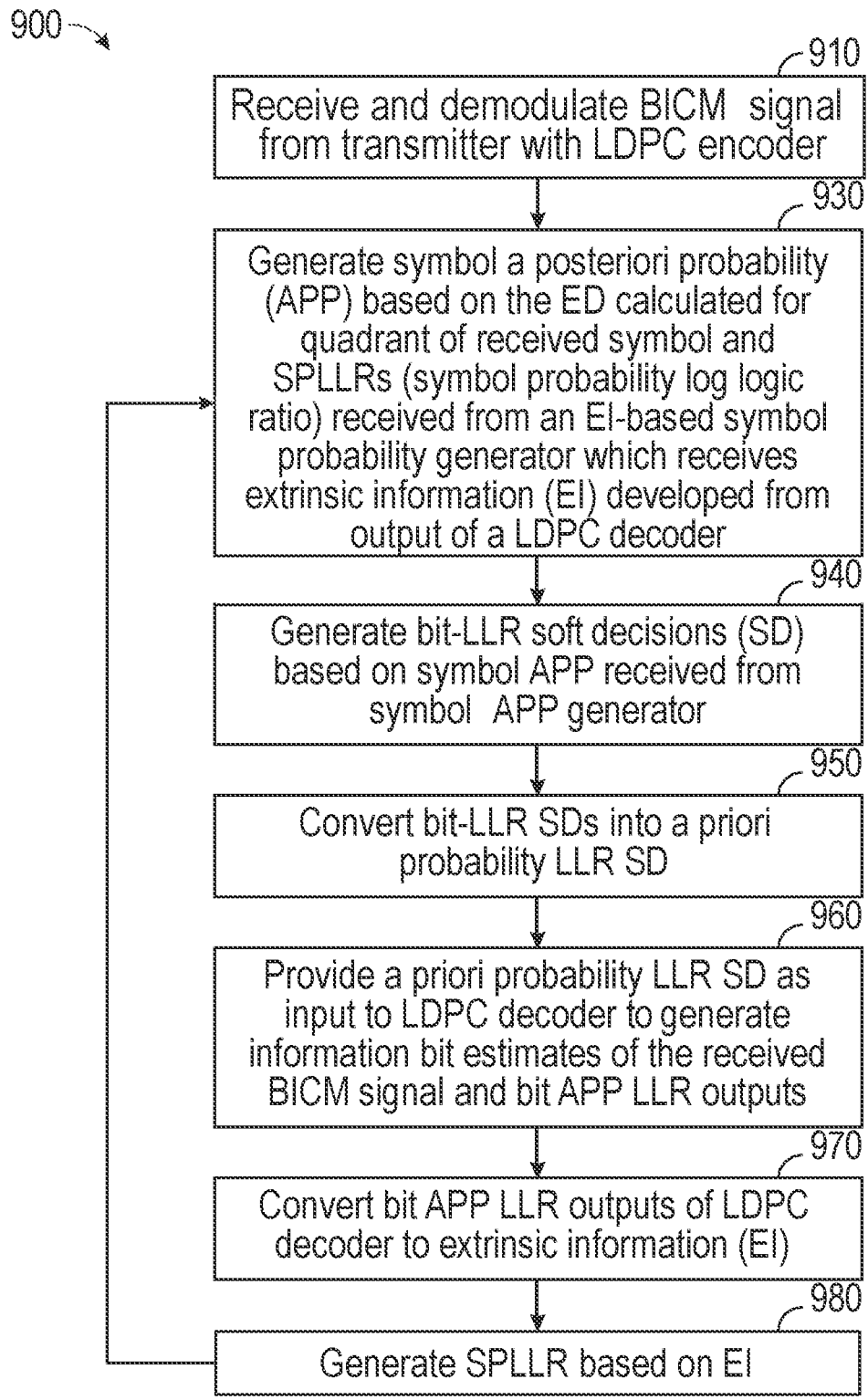
FIG. 9 illustrates a flowchart of operations of the receiver shown in FIG. 3.

FIG. 9 illustrates a flowchart 900 of operations of the receiver shown in FIG. 3. As shown in FIG. 9, in step 910, the demodulator 310 of FIG. 3 receives and demodulates a BIMC signal received over the channel 50 from the transmitter 100, (noting that the BICM signal is encoded by the transmitter 100 via the LDPC encoder 110). As discussed above, this Euclidean distance ED is calculated only for the quadrant that the received symbols are in and are used in step 930, together with the SPLLR received from EI-based symbol probability generator 380 (which receives extrinsic information (EI) developed from the output of the LDPC decoder 360 of FIG. 3) to generate the symbol a posteriori probability (APP) using the symbol APP generator 330.

Still referring to FIG. 9, in step 940, the bit-LLR soft decision generator (SD) 340 generates soft decisions based on the symbol APP received from the symbol APP generator 330. In step 950, these bit-LLR soft decisions are converted into a priori probability LLR soft decisions by passing the output of the bit-LLR generator 340 through the first subtractor 345, which subtracts the extrinsic information EI derived from the bit a posteriori probability LLR output of the LDPC decoder 360 from the output of the bit-LLR generator 340, and deinterleaving the output of a first subtractor 345 to provide the bit a priori probability LLR soft decision which is input to the LDPC decoder 360 (see step 960). As also shown in step 960, the a priori probability LLR soft decision input to the LDPC decoder 360 is used by the LDPC decoder 360 to generate both information bit estimates of the received BICM signal from the transmitter 100 as well as to generate a posteriori probability (APP) LLR outputs from the decoder 360 to be used as feedback signals for performing the next iteration of processing. In step 970, these APP LLR outputs of the LDPC decoder 360 are converted to extrinsic information (EI) by the operations of the second subtracter 365 and the interleaver 370, as described above. In step 980, the SPLLR is generated by the EI-based SPLLR generator 380 and fed to the symbol APP generator 330 (step 930), as also described above, to perform the next iteration of processing the received BICM signal until the termination criteria is reached.

Figure 10:
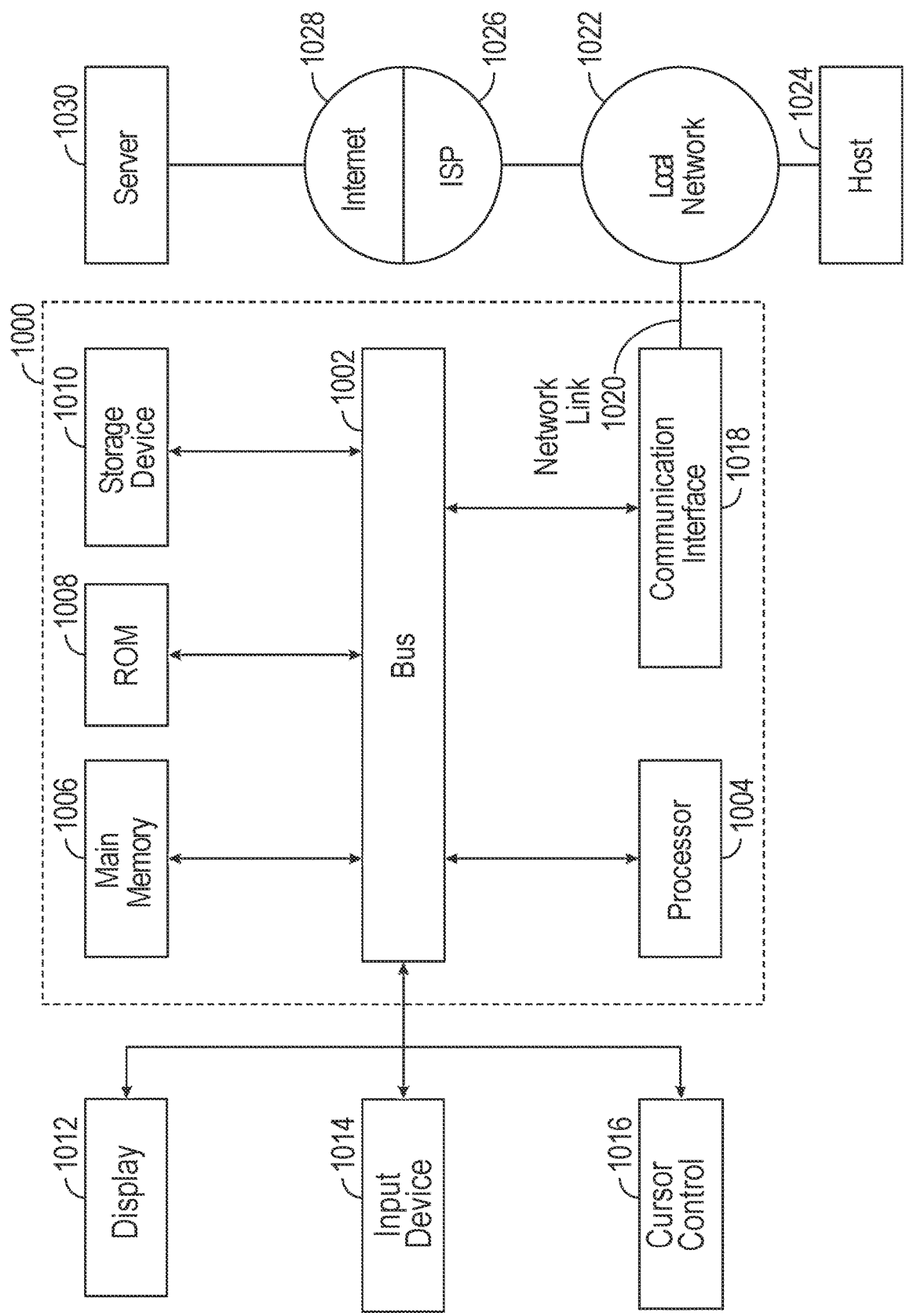
FIG. 10 is a block diagram of an example computing device, which may be used to provide implementations of the mechanisms described herein.

FIG. 10 is a block diagram showing an example a computer system 1000 upon which aspects of this disclosure may be implemented. The computer system 1000 may include a bus 1002 or other communication mechanism for communicating information, and a processor 1004 coupled with the bus 1002 for processing information. The computer system 1000 may also include a main memory 1006, such as a random-access memory (RAM) or other dynamic storage device, coupled to the bus 1002 for storing information and instructions to be executed by the processor 1004. The main memory 1006 may also be used for storing temporary variables or other intermediate information during execution of instructions to be executed by the processor 1004. The computer system 1000 may implement, for example, the BICM-ID systems described in FIGS. 1-9.

The computer system 1000 may further include a read-only memory (ROM) 1008 or other static storage device coupled to the bus 1002 for storing static information and instructions for the processor 1004. A storage device 1010, such as a flash or other non-volatile memory may be coupled to the bus 1002 for storing information and instructions.

The computer system 1000 may be coupled via the bus 1002 to a display 1012, such as a liquid crystal display (LCD), for displaying information. One or more user input devices, such as the example user input device 1014 may be coupled to the bus 1002, and may be configured for receiving various user inputs, such as user command selections and communicating these to the processor 1004, or to the main memory 1006. The user input device 1014 may include physical structure, or virtual implementation, or both, providing user input modes or options, and a cursor control 1016 for controlling, for example, a cursor, visible to a user through display 1012 or through other techniques, and such modes or operations may include, for example virtual mouse, trackball, or cursor direction keys.

The computer system 1000 may include respective resources of the processor 1004 executing, in an overlapping or interleaved manner, respective program instructions. Instructions may be read into the main memory 1006 from another machine-readable medium, such as the storage device 1010. In some examples, hard-wired circuitry may be used in place of or in combination with software instructions. The term "machine-readable medium" as used herein refers to any medium that participates in providing data that causes a machine to operate in a specific fashion. Such a medium may take forms, including but not limited to, non-volatile media, volatile media, and transmission media. Non-volatile media may include, for example, optical or magnetic disks, such as storage device 1010. Transmission media may include optical paths, or electrical or acoustic signal propagation paths, and may include acoustic or light waves, such as those generated during radio-wave and infra-red data communications, that are capable of carrying instructions detectable by a physical mechanism for input to a machine.

The computer system 1000 may also include a communication interface 1018 coupled to the bus 1002, for two-way data communication coupling to a network link 1020 connected to a local network 1022. The network link 1020 may provide data communication through one or more networks to other data devices. For example, the network link 1020 may provide a connection through the local network 1022 to a host computer 1024 or to data equipment operated by an Internet Service Provider (ISP) 1026 to access through the Internet 1028 a server 1030, for example, to obtain code for an application program.

While various embodiments have been described, the description is intended to be exemplary, rather than limiting, and it is understood that many more embodiments and implementations are possible that are within the scope of the embodiments.

In the following, further features, characteristics and advantages of the instant application will be described by means of items:

Item 1: A receiver is provided for receiving and processing bit-interleaved coded modulation (BICM) signals from a BICM transmitter to generate information bit estimates of information in the BICM signals, the receiver including a decoder configured to generate the information bit estimates of the information in the received BICM signals, a symbol a posteriori probability (APP) generator configured to generate first symbol a posteriori probabilities (APPs) by processing the BICM signals based on Euclidean distances computed only for a quadrant to which received symbols derived from the BICM signals belong, and further based on symbol probability log-likelihood ratios (SPLLRs) provided to the symbol APP generator by an extrinsic-information-based symbol probability log-likelihood ratio (SPLLR) generator, wherein the extrinsic-information-based SPLLR generator is configured to generate the SPLLRs directly from extrinsic information based on updated symbol APPs output from the decoder, without converting the extrinsic information into log-likelihoods (LLs), and the decoder is configured to generate the information bit estimates based on the first symbol APPs output from the symbol APP generator.

Item 2: The receiver of item 1, wherein the receiver further comprises a bit-LLR soft decision generator configured to receive the first symbol APPs, and to generate bit-LLR soft decisions to provide to the decoder based on the first symbol APPs received from the symbol APP generator.

Item 3: The receiver of items 1 or 2, wherein the decoder is configured to generate updated APPs, and further comprising a converter to convert the updated APPs to the extrinsic information to be provided to the SPLLR generator.

Item 4: The receiver of any one of items 1 to 3, wherein the symbol APP generator, the extrinsic-information-based SPLLR generator, and the bit-LLR soft decision generator form a demapper for demapping the received BICM signals using a two-dimensional (2D) constellation index having M-complex symbols, and wherein the extrinsic-information-based SPLLR generator only generates the SPLLR signals for bits equal to zero in the 2D constellation index.

Item 5: The receiver of any one of items 1 to 4, wherein the bit-LLR soft decision generator is configured to calculate the bit-LLR soft decisions using the SPLLRs.

Item 6: The receiver of any one of items 1 to 5, wherein the receiver further comprises a demodulator configured to receive and demodulate the BICM signals from the transmitter, and wherein the demapper further comprises a Euclidean distance calculator configured to receive the demodulated BICM signals from the demodulator, and to convert the demodulated BICM signals into Euclidean distances to provide to the symbol APP generator.

Item 7: The receiver of any one of items 1 to 6, wherein Euclidean distance calculator is configured to only calculate the Euclidean distances from one quadrant of the 2D constellation index.

Item 8: The receiver of any one of items 1 to 7, wherein a priori probability LLRs are provided as an input to the decoder based on the bit-LLR soft decisions output from the bit-LLR soft decision generator.

Item 9: The receiver of any one of items 1 to 8, wherein the converter comprises a subtracter configured to convert the updated APPs output from the decoder into the extrinsic information by subtracting the bit a priori probability LLR input to the decoder from the updated APPs output from the decoder.

Item 10: The receiver of any one of items 1 to 9 The receiver of claim 1, further comprising a deinterleaver located between the soft decisions output from the bit-LLR soft decision generator and the a priori probability input to the decoder, and an interleaver located between a subtractor and the extrinsic-information-based SPLLR generator.

Item 11: The receiver of any one of items 1 to 10, wherein the decoder is a low-density parity check code decoder.

Item 12: The receiver of any one of items 1 to 11, wherein for a first outer iteration for each received symbol, the quadrant is determined by the received symbol, and for the rest of the iteration the quadrant is determined by a maximum extrinsic based symbol probability.

Item 13: A method for receiving and processing bit-interleaved coded modulation (BICM) signals from a BICM transmitter to generate information bit estimates of information in the BICM signals, the method comprising generating, via a decoder, the information bit estimates of the information in the received BICM signals, generating, via a symbol a posteriori probability (APP) generator, first symbol a posteriori probabilities (APPs) by processing the BICM signals based on Euclidean distances computed only for a quadrant to which received symbols derived from the BICM signals belong, and further based on symbol probability log-likelihood ratios (SPLLRs) provided to the symbol APP generator by an extrinsic-information-based symbol probability log-likelihood ratio (SPLLR) generator, wherein the extrinsic-information-based SPLLR generator is configured to generate the SPLLRs directly from extrinsic information based on updated symbol APPs output from the decoder, without converting the extrinsic information into log-likelihoods (LLs), and the decoder is configured to generate the information bit estimates based on the first symbol APPs output from the symbol APP generator.

Item 14: The method of item 13, further comprising receiving, via a bit-LLR soft decision generator, the first symbol APPs, and generating bit-LLR soft decisions to provide to the decoder based on the first symbol APPs received from the symbol APP generator.

Item 15: The method of items 13 or 14, via the decoder, updated APPs, and converting, via a converter, the updated APPs to the extrinsic information to be provided to the SPLLR generator.

Item 16: The method of any one of items 13 to 15, wherein the symbol APP generator, the extrinsic-information-based SPLLR generator, and the bit-LLR soft decision generator form a demapper for demapping the received BICM signals using a two-dimensional (2D) constellation index having M-complex symbols, and wherein the extrinsic-information-based SPLLR generator only generates the SPLLR signals for bits equal to zero in the 2D constellation index.

Item 17: The method of any one of items 13 to 16, further comprising calculating, via the bit-LLR soft decision generator, the bit-LLR soft decisions using the SPLLRs.

Item 18: The method of any one of items 13 to 17, further comprising receiving and demodulating, via a demodulator, the BICM signals from the transmitter, and receiving, via a Euclidean distance calculator in the demapper, the demodulated BICM signals from the demodulator to convert the demodulated BICM signals into Euclidean distances to provide to the symbol APP generator.

Item 19: The method of any one of items 13 to 18, further comprising only calculating, via the Euclidean distance calculator, the Euclidean distances from one quadrant of the 2D constellation index.

Item 20: The method of any one of items 13 to 19, wherein a priori probability LLRs are provided as an input to the decoder based on the bit-LLR soft decisions output from the bit-LLR soft decision generator.

Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein.

Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. A receiver in a receiver-based interference cancellation satellite system, including a bit-interleaved coded modulation (BICM) transmitter for transmitting signals to the receiver over a satellite link, for receiving and processing bit-interleaved coded modulation (BICM) signals from the BICM transmitter to generate information bit estimates of information in the BICM signals to improve power efficiency of the satellite link, the receiver comprising:
   a decoder configured to generate the information bit estimates of the information in the received BICM signals;

a symbol a posteriori probability (APP) generator configured to generate first symbol a posteriori probabilities (APPs) by processing the BICM signals based on Euclidean distances computed only for a quadrant to which received symbols derived from the BICM signals belong, and further based on symbol probability log-likelihood ratios (SPLLRs) provided to the symbol APP generator by an extrinsic-information-based symbol probability log-likelihood ratio (SPLLR) generator, wherein:
  the extrinsic-information-based SPLLR generator is configured to generate the SPLLRs directly from extrinsic information based on updated symbol APPs output from the decoder, without converting the extrinsic information into log-likelihoods (LLs),
  the decoder is configured to generate the information bit estimates based on the first symbol APPs output from the symbol APP generator,
  the receiver further comprises a bit-LLR soft decision generator configured to receive the first symbol APPs, and to generate simplified bit-LLR soft decisions to provide to the decoder based on the first symbol APPs received from the symbol APP generator, and
  the bit-LLR soft decision generator is configured to calculate the simplified bit-LLR soft decisions using the SPLLRs to improve the power efficiency of the satellite link with the simplified bit-LLR soft decisions.

2. The receiver of claim 1, wherein the decoder is configured to generate updated APPs, and further comprising a converter to convert the updated APPs to the extrinsic information to be provided to the SPLLR generator.

3. The receiver of claim 2, wherein the symbol APP generator, the extrinsic-information-based SPLLR generator, and the bit-LLR soft decision generator form a demapper for demapping the received BICM signals using a two-dimensional (2D) constellation index having M-complex symbols, and wherein the extrinsic-information-based SPLLR generator only generates the SPLLR signals for bits equal to zero in the 2D constellation index.

4. The receiver of claim 3, wherein the receiver further comprises a demodulator configured to receive and demodulate the BICM signals from the transmitter, and wherein the demapper further comprises a Euclidean distance calculator configured to receive the demodulated BICM signals from the demodulator, and to convert the demodulated BICM signals into Euclidean distances to provide to the symbol APP generator.

5. The receiver of claim 4, wherein Euclidean distance calculator is configured to only calculate the Euclidean distances from one quadrant of the 2D constellation index.

6. The receiver of claim 5, wherein a priori probability LLRs are provided as an input to the decoder based on the bit-LLR soft decisions output from the bit-LLR soft decision generator.

7. The receiver of claim 4, wherein the converter comprises a subtracter configured to convert the updated APPs output from the decoder into the extrinsic information by subtracting the bit a priori probability LLR input to the decoder from the updated APPs output from the decoder.

8. The receiver of claim 6, further comprising a deinterleaver located between the soft decisions output from the bit-LLR soft decision generator and a priori probability LLRs input to the decoder, and an interleaver located between a subtracter and the extrinsic-information-based SPLLR generator.

9. The receiver of claim 1, wherein the decoder is a low-density parity check code decoder.

10. The receiver of claim 1, wherein for a first outer iteration for each received symbol, the quadrant is determined by the received symbol, and for other iterations of for each received symbol, the quadrant is determined by a maximum extrinsic based symbol probability.

11. A method using a receiver-based interference cancellation satellite system, including a bit-interleaved coded modulation (BICM) transmitter for transmitting signals to a receiver over a satellite link, for receiving and processing bit-interleaved coded modulation (BICM) signals from the BICM transmitter to generate information bit estimates of information in the BICM signals to improve power efficiency of the satellite link, the method comprising:
  generating, via a decoder, the information bit estimates of the information in the received BICM signals;
  generating, via a symbol a posteriori probability (APP) generator, first symbol a posteriori probabilities (APPs) by processing the BICM signals based on Euclidean distances computed only for a quadrant to which received symbols derived from the BICM signals belong, and further based on symbol probability log-likelihood ratios (SPLLRs) provided to the symbol APP generator by an extrinsic-information-based symbol probability log-likelihood ratio (SPLLR) generator, wherein:
  the extrinsic-information-based SPLLR generator is configured to generate the SPLLRs directly from extrinsic information based on updated symbol APPs output from the decoder, without converting the extrinsic information into log-likelihoods (LLs), and
  the decoder is configured to generate the information bit estimates based on the first symbol APPs output from the symbol APP generator,
  the receiver further comprises a bit-LLR soft decision generator configured to receive the first symbol APPs, and to generate simplified bit-LLR soft decisions to provide to the decoder based on the first symbol APPs received from the symbol APP generator, and
  the bit-LLR soft decision generator is configured to calculate the simplified bit-LLR soft decisions using the SPLLRs to improve the power efficiency of the satellite link with the simplified bit-LLR soft decisions.

12. The method of claim 11, generating, via the decoder, updated APPs, and converting, via a converter, the updated APPs to the extrinsic information to be provided to the SPLLR generator.

13. The method of claim 12, wherein the symbol APP generator, the extrinsic-information-based SPLLR generator, and the bit-LLR soft decision generator form a demapper for demapping the received BICM signals using a two-dimensional (2D) constellation index having M-complex symbols, and wherein the extrinsic-information-based SPLLR generator only generates the SPLLR signals for bits equal to zero in the 2D constellation index.

14. The method of claim 13, further comprising receiving and demodulating, via a demodulator, the BICM signals from the transmitter, and receiving, via a Euclidean distance calculator in the demapper, the demodulated BICM signals from the demodulator to convert the demodulated BICM signals into Euclidean distances to provide to the symbol APP generator.

15. The method of claim 14, further comprising only calculating, via the Euclidean distance calculator, the Euclidean distances from one quadrant of the 2D constellation index.

16. The method of claim 15, wherein a priori probability LLRs are provided as an input to the decoder based on the bit-LLR soft decisions output from the bit-LLR soft decision generator.

* * * * *